US012550339B2

(12) United States Patent
Nakajima et al.

(10) Patent No.: US 12,550,339 B2
(45) Date of Patent: Feb. 10, 2026

(54) SEMICONDUCTOR MEMORY DEVICE AND METHOD OF MANUFACTURING THE SAME

(71) Applicant: Kioxia Corporation, Tokyo (JP)

(72) Inventors: Yasuhito Nakajima, Yokkaichi Mie (JP); Kosei Noda, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 421 days.

(21) Appl. No.: 18/338,021

(22) Filed: Jun. 20, 2023

(65) Prior Publication Data

US 2024/0081084 A1 Mar. 7, 2024

(30) Foreign Application Priority Data

Sep. 7, 2022 (JP) .................... 2022-142577

(51) Int. Cl.
*H10B 80/00* (2023.01)
*H01L 23/00* (2006.01)
(Continued)

(52) U.S. Cl.
CPC ............ *H10B 80/00* (2023.02); *H01L 24/08* (2013.01); *H01L 24/80* (2013.01);
(Continued)

(58) Field of Classification Search
None
See application file for complete search history.

(56) References Cited

U.S. PATENT DOCUMENTS 6,285,045 B1 * 9/2001 Itabashi ............... H10B 12/033
257/E21.507
11,594,546 B2   2/2023 Morozumi et al.
(Continued)

FOREIGN PATENT DOCUMENTS

CN   1870261 A * 11/2006 ........... H10D 86/441
JP   2001144266 A * 5/2001 ............. H01L 28/65
(Continued)

OTHER PUBLICATIONS

U.S. Appl. No. 17/941,987, filed Sep. 9, 2022, Kioxia Corporation.

*Primary Examiner* — Michael Lebentritt
(74) *Attorney, Agent, or Firm* — Foley & Lardner LLP

(57) ABSTRACT

A semiconductor memory device includes a substrate, a plurality of first conductive layers arranged in a first direction intersecting with a surface of the substrate, a memory structure including a first semiconductor layer opposed to the first conductive layers, a first wiring, a second conductive layer, a first insulating layer separating the plurality of first conductive layers in a second direction, a second insulating layer separating one or a plurality of the first conductive layers disposed on a side closest to the substrate, and a third insulating layer separating one or a plurality of the first conductive layers disposed on a side farthest from the substrate. The memory structure has a tapered shape having a width in the second direction decreasing with increasing distance from the substrate, and the third insulating layer has a tapered shape having a width in the second direction decreasing with decreasing distance from the substrate.

20 Claims, 28 Drawing Sheets

(51) Int. Cl.
*H01L 25/00* (2006.01)
*H01L 25/065* (2023.01)
*H01L 25/18* (2023.01)

(52) U.S. Cl.
CPC .......... *H01L 25/0657* (2013.01); *H01L 25/18* (2013.01); *H01L 25/50* (2013.01); *H01L 2224/08145* (2013.01); *H01L 2224/80006* (2013.01); *H01L 2224/80895* (2013.01); *H01L 2224/80896* (2013.01); *H01L 2924/1431* (2013.01); *H01L 2924/14511* (2013.01)

(56) References Cited

U.S. PATENT DOCUMENTS

| | | | |
|---|---|---|---|
| 2014/0217611 A1* | 8/2014 | Mizukami | H01L 21/76883 257/774 |
| 2015/0372122 A1* | 12/2015 | Hodo | H01L 21/32136 438/104 |
| 2016/0232976 A1* | 8/2016 | Inden | H10B 41/40 |
| 2017/0062527 A1* | 3/2017 | Konno | H10B 63/84 |
| 2019/0214067 A1 | 7/2019 | Nam et al. | |
| 2020/0185408 A1 | 6/2020 | Song et al. | |
| 2022/0077182 A1 | 3/2022 | Lee | |
| 2022/0093636 A1* | 3/2022 | Murakami | H10B 41/27 |
| 2022/0285379 A1* | 9/2022 | Suzuki | H10B 43/35 |
| 2023/0301111 A1 | 9/2023 | Yamada et al. | |

FOREIGN PATENT DOCUMENTS

| | | | | |
|---|---|---|---|---|
| JP | 2017147337 A | * | 8/2017 | ....... H01L 21/76877 |
| JP | 2020-178010 | | 10/2020 | |
| JP | 2022-513730 A | | 2/2022 | |
| JP | 2023-137979 A | | 9/2023 | |
| KR | 20060131677 A | * | 12/2006 | ....... H01L 21/76229 |
| KR | 20220099230 A | * | 7/2022 | ......... H01L 23/5283 |
| KR | 20230117769 A | * | 8/2023 | ........... H01L 23/528 |
| WO | WO-2020179006 A1 | * | 9/2020 | ......... H10N 70/8833 |

* cited by examiner

SEMICONDUCTOR MEMORY DEVICE AND METHOD OF MANUFACTURING THE SAME

CROSS-REFERENCE TO RELATED APPLICATIONS

This application is based upon and claims the benefit of Japanese Patent Application No. 2022-142577, filed on Sep. 7, 2022, the entire contents of which are incorporated herein by reference.

BACKGROUND

Field

Embodiments described herein relate generally to a semiconductor memory device and a method for manufacturing the same.

DESCRIPTION OF THE RELATED ART

There has been known a semiconductor memory device that includes a substrate, a plurality of conductive layers stacked in a direction intersecting with a surface of this substrate, a semiconductor layer opposed to these plurality of conductive layers, and a gate insulating layer disposed between the conductive layers and the semiconductor layer. The gate insulating layer includes a memory portion that can store data, and the memory portion is, for example, an insulating electric charge accumulating layer and a conductive electric charge accumulating layer, such as a floating gate.

DETAILED DESCRIPTION

Figure 1:
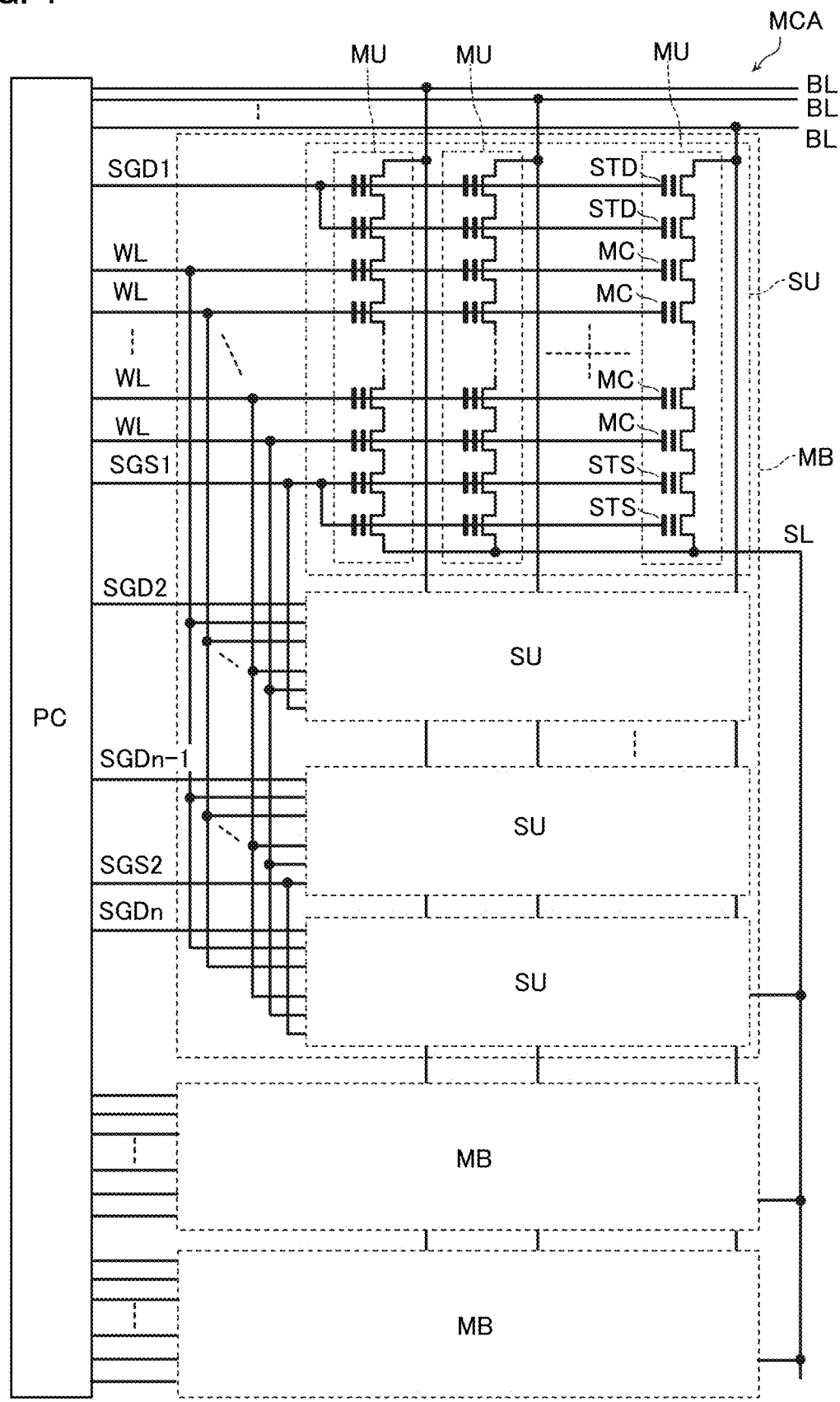
FIG. 1 is a schematic circuit diagram illustrating a configuration of a memory die MD according to a first embodiment.

A semiconductor memory device according to one embodiment comprises: a substrate; a plurality of first conductive layers arranged in a first direction intersecting with a surface of the substrate; a memory structure extending in the first direction, the memory structure including a first semiconductor layer opposed to the plurality of first conductive layers and a gate insulating layer disposed between the first semiconductor layer and the plurality of first conductive layers; a first wiring connected to an end portion on a side close to the substrate of the first semiconductor layer, the first wiring extending in a second direction intersecting with the first direction; a second conductive layer connected to an end portion on a side far from the substrate of the first semiconductor layer; a first insulating layer separating the plurality of first conductive layers in the second direction, the first insulating layer extending in a third direction and the first direction, the third direction intersecting with the first direction and the second direction; a second insulating layer separating one or a plurality of the first conductive layers disposed on a side closest to the substrate among the plurality of first conductive layers in the second direction, the second insulating layer extending in the first direction and the third direction; and a third insulating layer separating one or a plurality of the first conductive layers disposed on a side farthest from the substrate among the plurality of first conductive layers in the second direction, the third insulating layer extending in the first direction and the third direction. The memory structure has a tapered shape having a width in the second direction decreasing with increasing distance from the substrate. The third insulating layer has a tapered shape having a width in the second direction decreasing with decreasing distance from the substrate.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

In this specification, when it is referred that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction intersecting with a predetermined plane may be referred to as a first direction, a direction along this predetermined plane may be referred to as a second direction, and a direction along this predetermined plane and intersecting with the second direction may be referred to as a third direction. These first direction, second direction, and third direction may each correspond to any of the Z-direction, the Y-direction, and the X-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

In this specification, when referring to a "width", a "length", a "thickness", or the like of a configuration, a member, or the like in a predetermined direction, this may mean a width, a length, a thickness, or the like in a cross-sectional surface or the like observed with a Scanning electron microscopy (SEM), a Transmission electron microscopy (TEM), or the like.

First Embodiment

[Circuit Configuration]

FIG. 1 is an equivalent circuit diagram schematically illustrating a configuration of a semiconductor memory device according to the first embodiment.

The semiconductor memory device according to the embodiment includes a memory cell array MCA and a peripheral circuit PC controlling the memory cell array MCA.

The memory cell array MCA includes a plurality of memory blocks MB. These plurality of memory blocks MB each include a plurality of string units SU. These plurality of string units SU each include a plurality of memory units MU. These plurality of memory units MU have one ends each connected to the peripheral circuit PC via a bit line BL. These plurality of memory units MU have other ends each connected to the peripheral circuit PC via a common source line SL.

The memory unit MU includes one or a plurality of drain select transistors STD, a plurality of memory cells MC, and one or a plurality of source select transistors STS, which are connected in series between the bit line BL and the source line SL. Hereinafter, the drain select transistor STD and the source select transistor STS may be simply referred to as select transistors (STD, STS) or the like.

The memory cell MC is a field-effect type transistor (memory transistor) that includes a semiconductor layer, a gate insulating film (gate insulating layer), and a gate electrode. The semiconductor layer functions as a channel region. The gate insulating film includes a memory portion configured to be able to store data. This memory portion is an electric charge accumulating film, such as a silicon nitride film (SiN) or a floating gate. The memory cell MC has a threshold voltage that changes according to an electric charge amount in the electric charge accumulating film. Respective word lines WL are connected to the gate electrodes of the plurality of memory cells MC included in one memory unit MU. Each of these word lines WL is connected to the memory cells MC at the same position in a series direction of all the memory units MU in one memory block MB in common.

The select transistors (STD, STS) are field-effect type transistors each including a semiconductor layer that functions as a channel region, a gate insulating film, and a gate electrode. While this example is illustrated such that one memory unit MU includes two drain select transistors STD and two source select transistors STS, the respective numbers of the select transistors STD, STS provided in one memory unit MU may be one, or may be three or more. Select gate lines (SGD, SGS) are connected to the gate electrodes of the select transistors (STD, STS), respectively.

The drain select gate line SGD is separately provided for each of the string units SU, and connected to all the drain select transistors STD in one string unit SU in common. In FIG. 1, the drain select gate lines SGD connected to the respective string units SU are illustrated as drain select gate lines SGD1, SGD2, . . . , SGDn−1, and SGDn.

The source select gate line SGS is separately provided for each of one or a plurality of string units SU in one memory block MB, and is connected to all the source select transistors STS in the one or the plurality of string units SU in common. In FIG. 1, a plurality of string units SU included in one memory block MB are divided into two, the source select gate line SGS connected to a plurality of the string units SU in one is illustrated as a source select gate line SGS1, and the source select gate line SGS connected to a plurality of the string units SU in the other is illustrated as a source select gate line SGS2.

[Structure of Memory Die MD]

Figure 2:
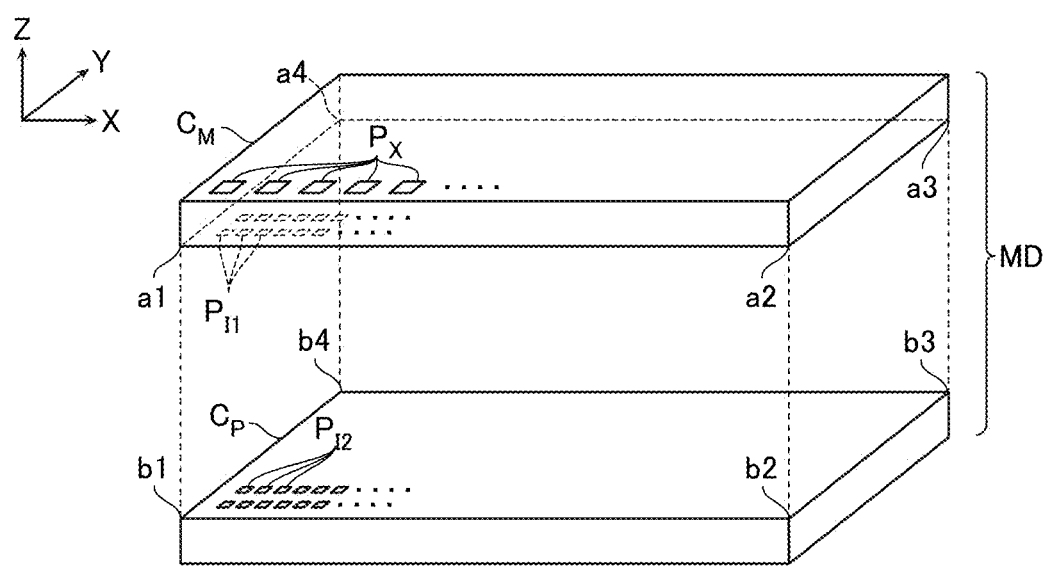
FIG. 2 is a schematic perspective view illustrating the configuration of the memory die MD.

FIG. 2 is a schematic exploded perspective view illustrating an exemplary configuration of the semiconductor memory device according to the embodiment. The semiconductor memory device according to the embodiment includes a memory die MD. The memory die MD includes a chip $C_M$ including the memory cell array MCA and a chip $C_P$ including the peripheral circuit PC.

On an upper surface of the chip $C_M$, a plurality of bonding pad electrodes $P_X$ are disposed. On a lower surface of chip $C_M$, a plurality of first bonding electrodes $P_{I1}$ are disposed. On an upper surface of the chip $C_P$, a plurality of second bonding electrodes $P_{I2}$ are disposed. Hereinafter, in the chip $C_M$, the surface on which the plurality of first bonding electrodes $P_{I1}$ are disposed is referred to as a front surface, and the surface on which the plurality of bonding pad electrodes $P_X$ are disposed is referred to as a back surface. In the chip $C_P$, the surface on which the plurality of second bonding electrodes $P_{I2}$ are disposed is referred to as a front surface, and a surface in the opposite side of the front surface is referred to as a back surface. In the illustrated example, the front surface of the chip $C_P$ is disposed above the back surface of the chip $C_P$, and the back surface of the chip $C_M$ is disposed above the front surface of the chip $C_M$.

The chip $C_M$ and the chip $C_P$ are disposed such that the front surface of the chip $C_M$ is opposed to the front surface of the chip $C_P$. The plurality of first bonding electrodes $P_{I1}$ are disposed corresponding to the respective plurality of second bonding electrodes $P_{I2}$, and disposed at positions allowing bonding to the plurality of second bonding electrodes $P_{I2}$. The first bonding electrode $P_{I1}$ and the second bonding electrode $P_{I2}$ function as bonding electrodes that bond the chip $C_M$ and the chip $C_P$ together and electrically conduct the chip $C_M$ and the chip $C_P$. The bonding pad electrode $P_X$ functions as an electrode for electrically connecting the memory die MD to a controller die (not illustrated) or the like.

In the example of FIG. 2, corner portions a1, a2, a3, and a4 of the chip $C_M$ correspond to corner portions b1, b2, b3, and b4 of the chip $C_P$, respectively.

Figure 3:
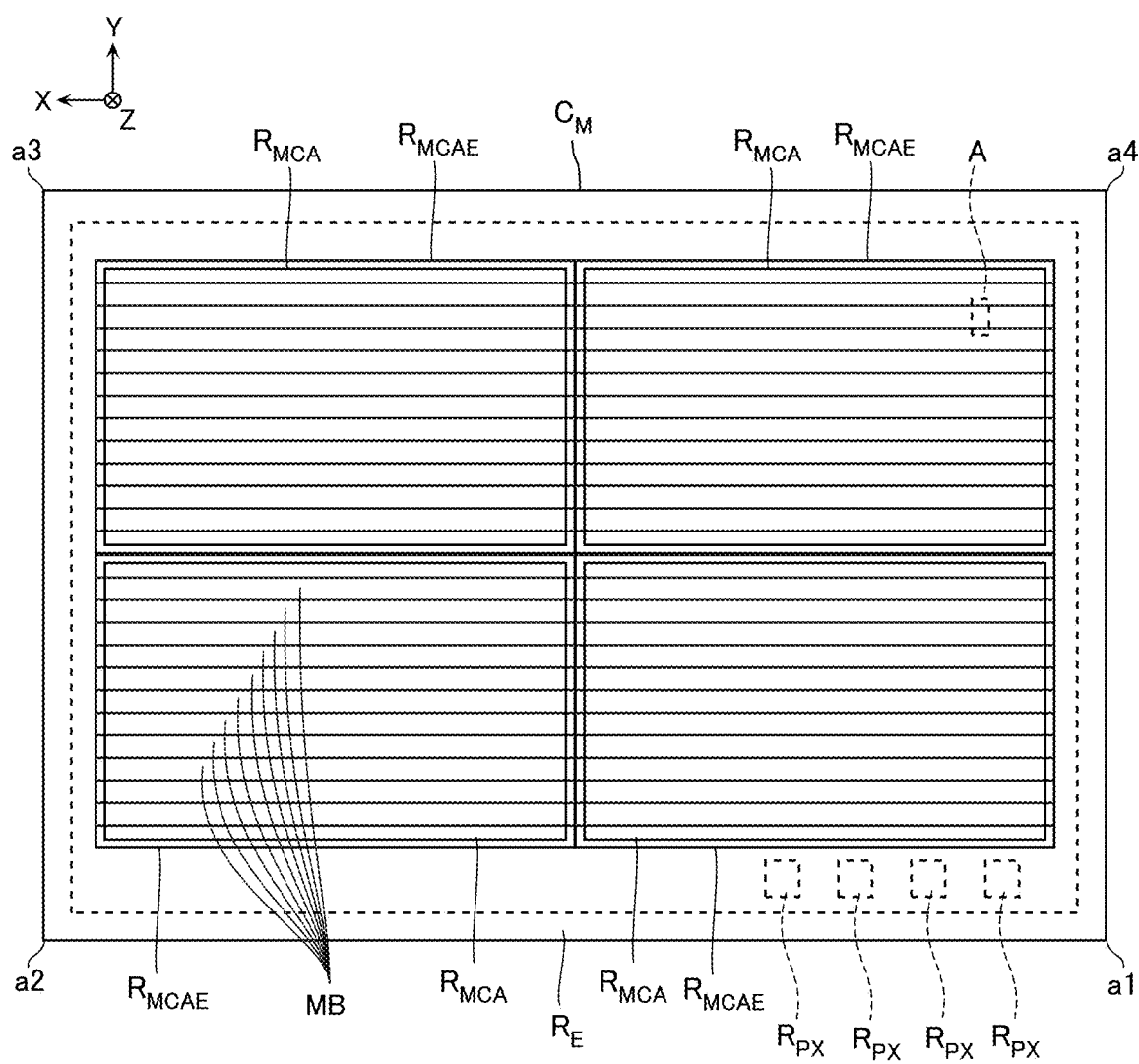
FIG. 3 is a schematic bottom view illustrating a configuration of a chip $C_M$.
Figure 4:
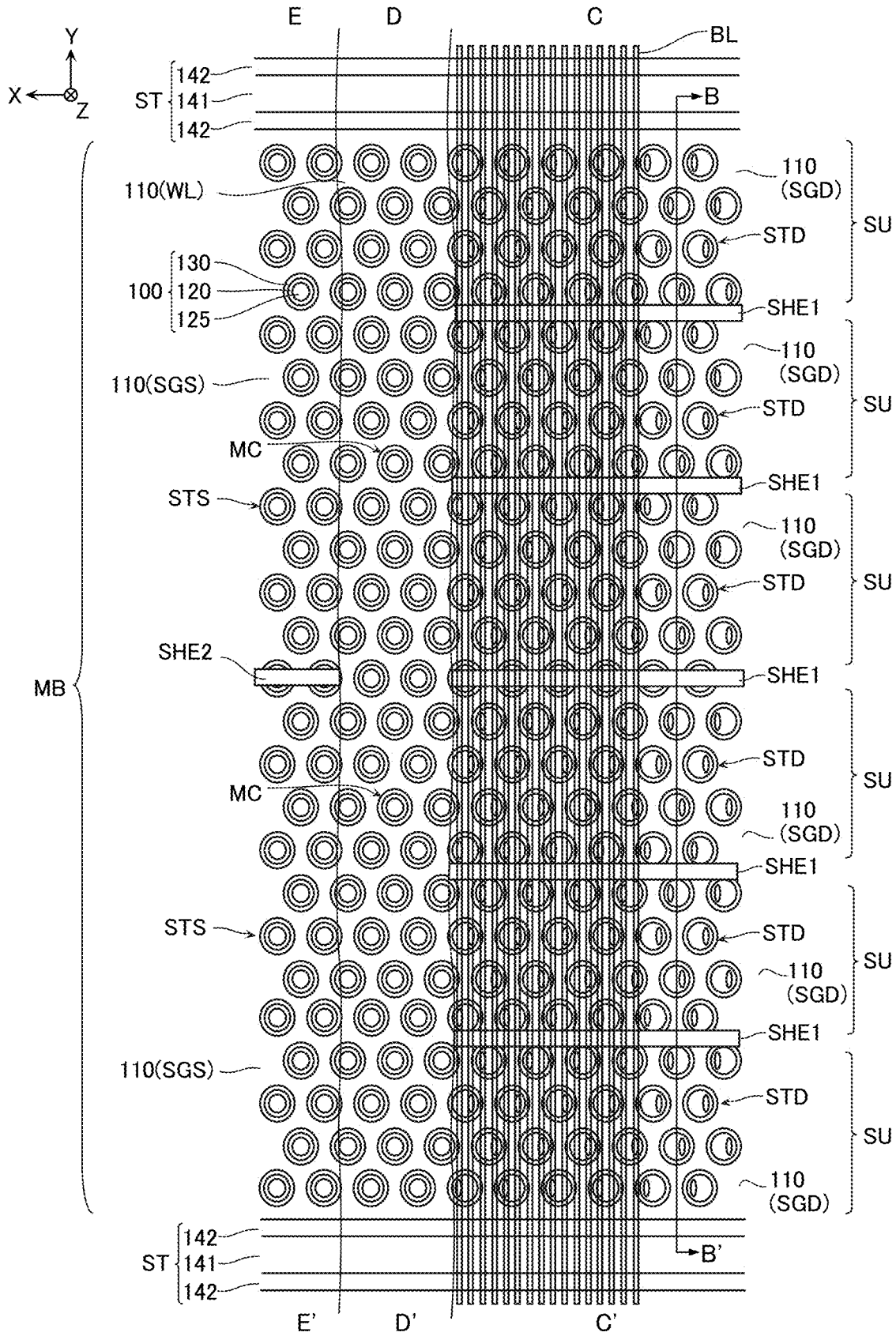
FIG. 4 is a schematic bottom view illustrating a part of the configuration of the chip $C_M$.
Figure 5:
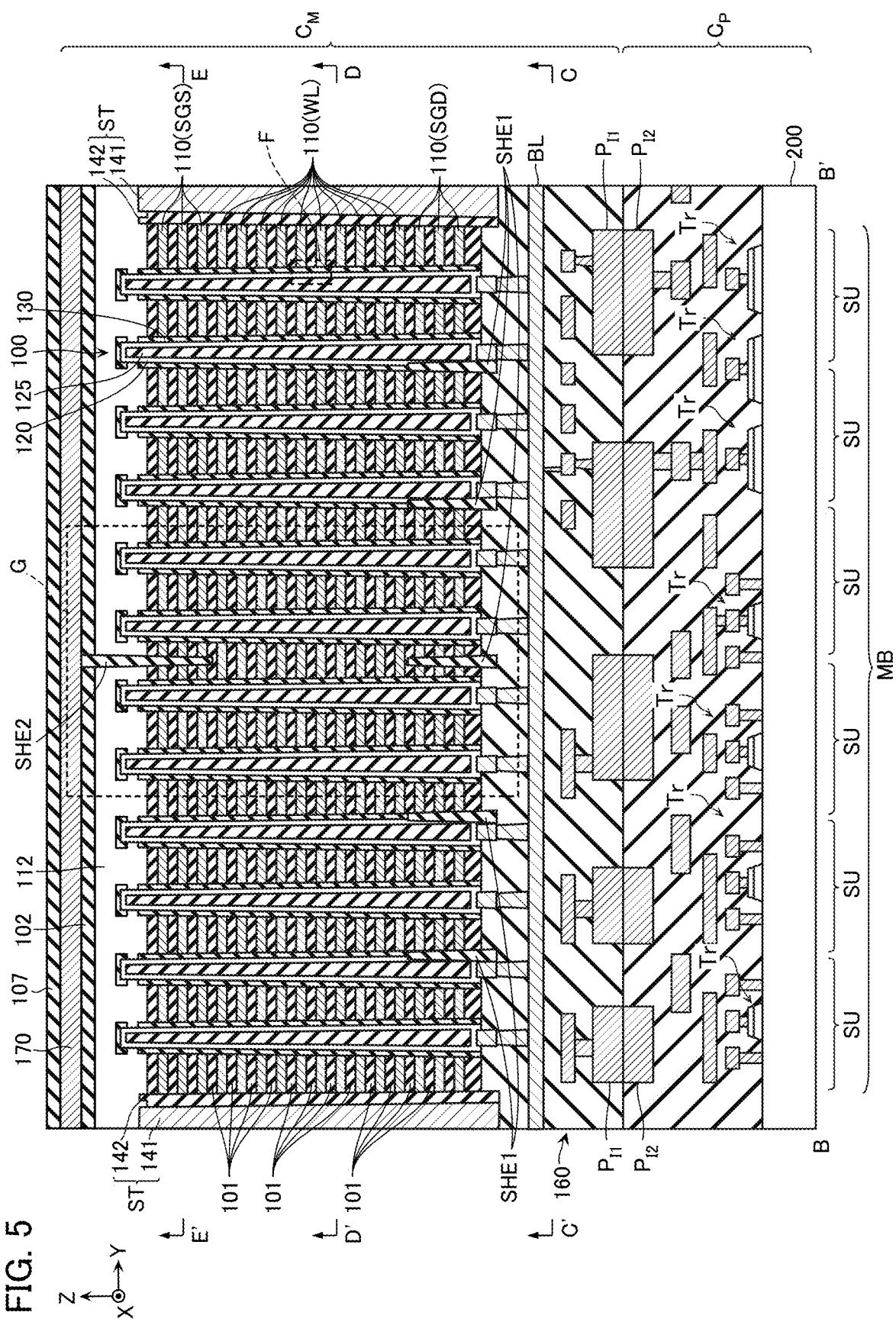
FIG. 5 is a schematic cross-sectional view illustrating a part of the configuration of the chip $C_M$.
Figure 6:
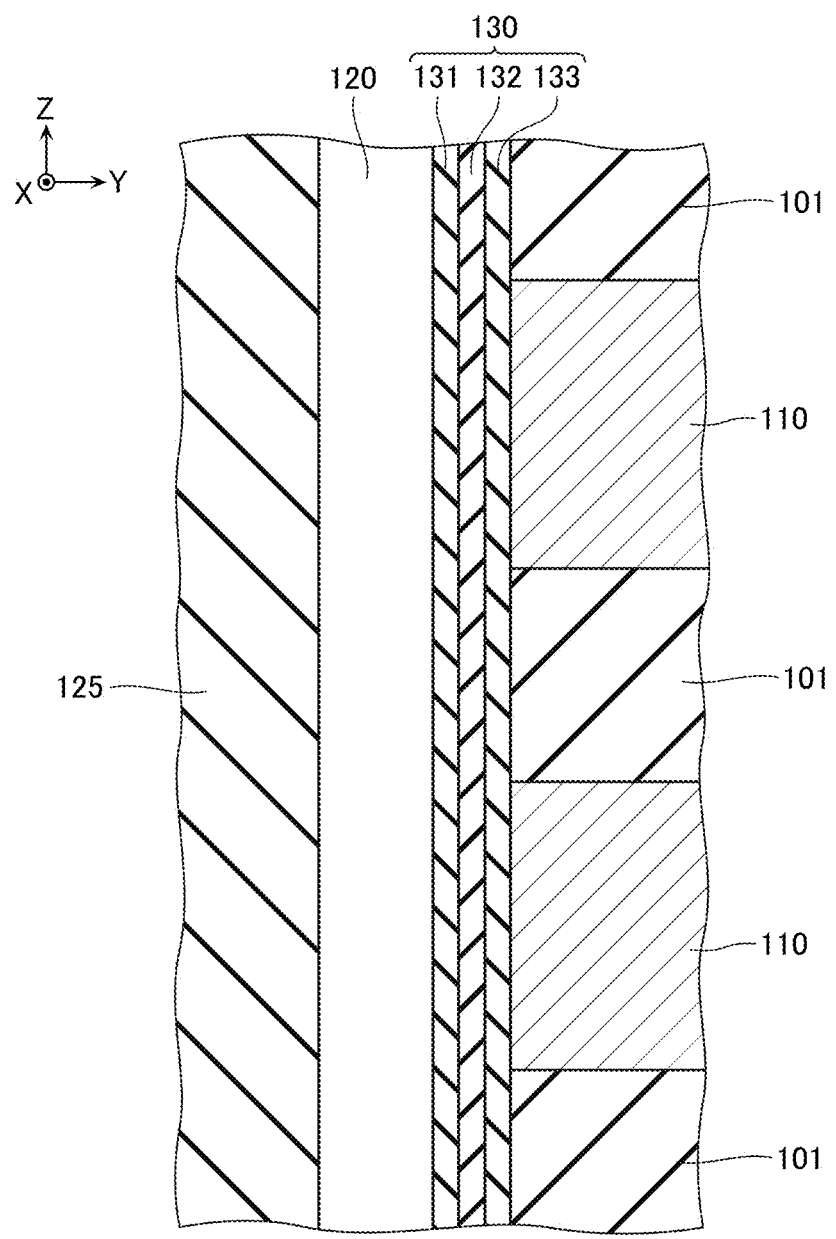
FIG. 6 is a schematic cross-sectional view illustrating a part of the configuration of the chip $C_M$.
Figure 7:
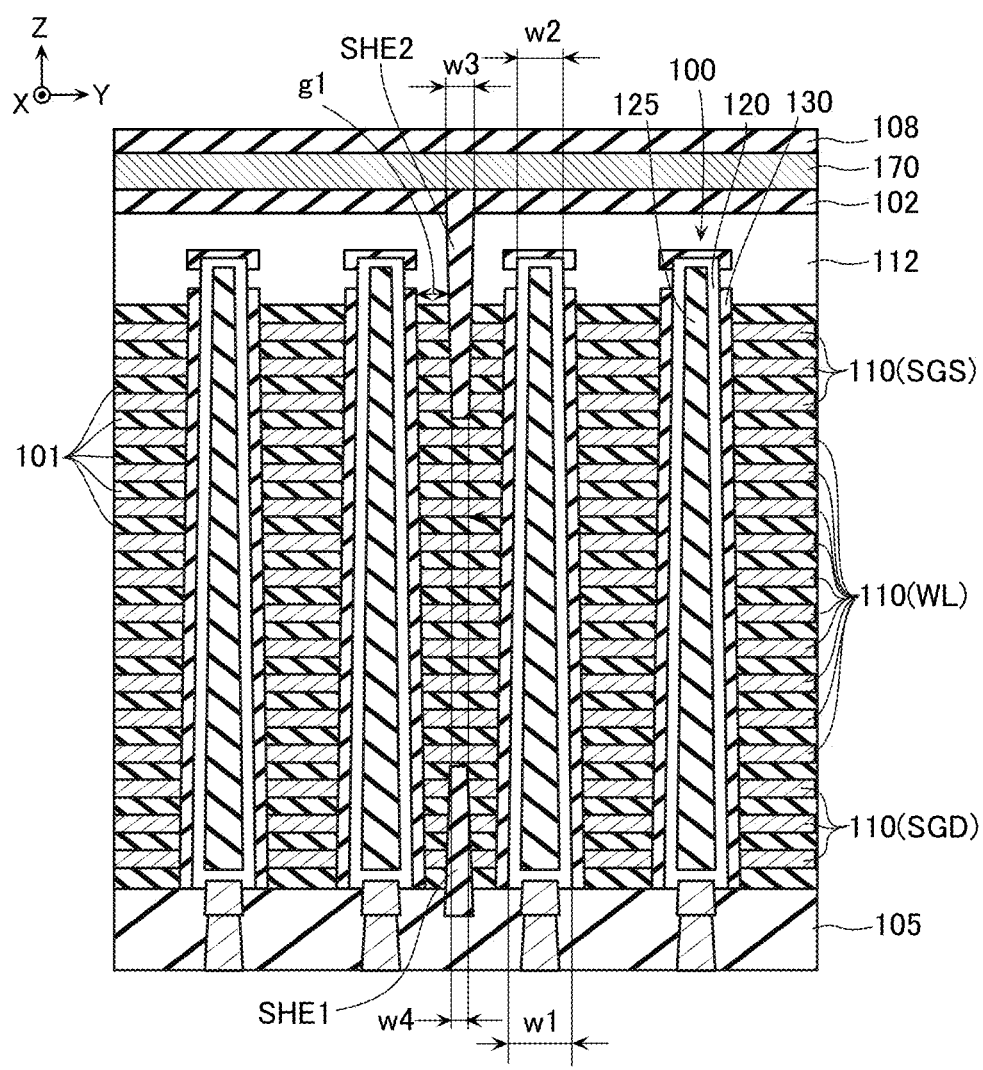
FIG. 7 is a schematic cross-sectional view illustrating a part of the configuration of the chip $C_M$.

FIG. 3 is a schematic bottom view illustrating a configuration of the chip $C_M$. FIG. 4 is a schematic enlarged bottom view illustrating the configuration of the part indicated by A of FIG. 3. FIG. 4 illustrates plan views of a structure of FIG. 5 taken along the line C-C', the line D-D', and the line E-E' viewed in an arrow direction and arranged in the X-direction. FIG. 5 is a schematic cross-sectional view of the memory die MD taken along the line B-B' of FIG. 4 viewed in an arrow direction. FIG. 6 is a schematic enlarged cross-sectional view of the configuration of the part indicated by F of FIG. 5. FIG. 7 is a schematic enlarged cross-sectional view of the structure of the part indicated by G of FIG. 5.

[Structure of Chip $C_M$]

For example, as illustrated in FIG. 3, the chip $C_M$ includes four memory cell array regions $R_{MCA}$ arranged in the X-direction and the Y-direction, a memory cell array outer peripheral region $R_{MCAE}$ disposed along an outer periphery of the memory cell array regions $R_{MCA}$, a plurality of bonding pad electrode regions $R_{PX}$ corresponding to the plurality of bonding pad electrodes $P_X$, and an edge seal region $R_E$ disposed along an outer edge portion of the chip $C_M$.

The memory cell array region $R_{MCA}$ includes a plurality of memory blocks MB arranged in the Y-direction. Between the memory blocks MB adjacent in the Y-direction, for example, as illustrated in FIG. 4 and FIG. 5, inter-block structures ST extending in the X-direction and the Z-direction are each disposed.

As illustrated in FIG. 5, the memory block MB includes a plurality of conductive layers 110 arranged in the Z-direction, and a plurality of memory structures 100 extending in the Z-direction.

Each of the plurality of conductive layers 110 is an approximately plate-shaped conductive layer extending in the X-direction. The conductive layer 110 may include, for example, a stacked film of a barrier conductive film of titanium nitride (TiN) or the like and a metal film of tungsten (W) or the like. The conductive layer 110 may contain, for example, polycrystalline silicon containing N-type impurities, such as phosphorus (P), or P-type impurities, such as boron (B). Between the plurality of conductive layers 110 arranged in the Z-direction, insulating layers 101 of silicon oxide ($SiO_2$) or the like are disposed.

Among the plurality of conductive layers 110, one or a plurality of conductive layers 110 positioned at uppermost layers function as the source select gate lines SGS and gate electrodes of a plurality of source select transistors STS (FIG. 1) connected to the source select gate lines SGS. Hereinafter, such a conductive layer 110 is referred to as a conductive layer 110 (SGS) in some cases.

Among the plurality of conductive layers 110, one or a plurality of conductive layers 110 positioned at lowermost layers function as the drain select gate lines SGD and gate electrodes of a plurality of drain select transistors STD (FIG. 1) connected to the drain select gate lines SGD. Hereinafter, such a conductive layer 110 is referred to as a conductive layer 110 (SGD) in some cases.

Among the plurality of conductive layers 110, a plurality of conductive layers 110 disposed between the conductive layers 110 (SGS) and the conductive layers 110 (SGD) function as the word lines WL and gate electrodes of a plurality of memory cells MC (FIG. 1) connected to the word lines WL. Hereinafter, such a conductive layer 110 is referred to as a conductive layer 110 (WL) in some cases.

The memory structure 100 includes a semiconductor layer 120 extending in the Z-direction, and a gate insulating film 130 (gate insulating layer) disposed between the plurality of conductive layers 110 and the semiconductor layer 120. One or a plurality of the source select transistors STS (FIG. 1) are configured at positions opposed to the conductive layers 110 (SGS) of the memory structure 100. One or a plurality of the drain select transistors STD (FIG. 1) are configured at positions opposed to the conductive layers 110 (SGD) of the memory structure 100. A plurality of the memory cells MC (FIG. 1) are configured at positions opposed to the conductive layers 110 (WL) of the memory structure 100.

For example, as illustrated in FIG. 4, the memory structures 100 are arranged in the X-direction and the Y-direction in a predetermined pattern. The semiconductor layer 120 of the memory structure 100 functions as, for example, channel regions of the plurality of memory cells. The semiconductor layer 120 includes, for example, polycrystalline silicon (Si) or the like. For example, as illustrated in FIG. 5, the semiconductor layer 120 has an approximately closed-bottomed cylindrical shape, and an insulating layer 125 of silicon oxide or the like is disposed in the center portion. The semiconductor layer 120 has an outer peripheral surface opposed to the conductive layers 110. The gate insulating film 130 is disposed between the semiconductor layer 120 and the conductive layers 110.

On the uppermost insulating layer 101, a conductive layer 112 of polycrystalline silicon (Si) or the like is disposed. In the upper end portion of the semiconductor layer 120, an impurity region containing N-type impurities, such as phosphorus (P), or P-type impurities, such as boron (B), is disposed. The upper end portion of the semiconductor layer 120 is covered with the gate insulating film 130. The gate insulating film 130 is partially removed, and a side surface of the upper end portion of the semiconductor layer 120 is partially exposed and electrically connected to the conductive layer 112.

In the lower end portion of the semiconductor layer 120, an impurity region containing N-type impurities, such as phosphorus (P), is disposed. This impurity region covers the lower end of the insulating layer 125. This impurity region is electrically connected to the bit line BL. The bit line BL is electrically connected to the configuration inside the chip $C_P$ via the above-described first bonding electrode $P_{l1}$.

The gate insulating film 130 has an approximately cylindrical shape covering the outer peripheral surface of the semiconductor layer 120. For example, as illustrated in FIG. 6, the gate insulating film 130 includes a tunnel insulating film 131, an electric charge accumulating film 132, and a block insulating film 133, which are stacked between the semiconductor layer 120 and the conductive layers 110. The tunnel insulating film 131 and the block insulating film 133 are, for example, insulating films of silicon oxide ($SiO_2$) or the like. The electric charge accumulating film 132 is, for example, a film of silicon nitride ($Si_3N_4$) or the like configured to be able to accumulate electric charge. The tunnel insulating film 131, the electric charge accumulating film 132, and the block insulating film 133 each have an approximately cylindrical shape, and extend in the Z-direction along the outer peripheral surface of the semiconductor layer 120.

FIG. 6 illustrates an example in which the gate insulating film 130 includes the electric charge accumulating film 132 of silicon nitride or the like. However, the gate insulating film 130 may include, for example, a floating gate of polycrystalline silicon or the like containing N-type or P-type impurities.

For example, as illustrated in FIG. 4 and FIG. 5, the inter-block structure ST extends in the X-direction and the Z-direction, and separates the plurality of conductive layers 110 and the plurality of insulating layers 101 in the Y-direction for each memory block MB. The inter-block structure ST includes, for example, a conductive layer 141 extending in the X-direction and the Z-direction, and insulating layers 142 of silicon oxide ($SiO_2$) or the like disposed on side surfaces in the Y-direction of the conductive layer 141. The conductive layer 141 may include, for example, a stacked film of a barrier conductive film of titanium nitride (TiN) or the like and a metal film of tungsten (W) or the like. The conductive layer 141 functions as, for example, a part of the source line. The conductive layer 141 has an upper end portion positioned above the upper surface of the uppermost insulating layer 101. The upper end portion of the conductive layer 141 is electrically connected to the conductive layer 112.

The conductive layer 112 may contain, for example, polycrystalline silicon or the like containing N-type impurities, such as phosphorus (P), or P-type impurities, such as boron (B). The conductive layer 112 functions as, for example, a part of the source line. The conductive layer 112 is in contact with the upper surface of the insulating layer 101, the upper end portion of the semiconductor layer 120, and the upper end portion of the conductive layer 141.

The conductive layer 112 and the conductive layers 110 (SGS) are separated into two in the Y-direction at the center portion in the Y-direction of the memory block MB by a source-side dividing insulating layer SHE2. Therefore, a width in the Y-direction of the conductive layer 110 (SGS) is approximately ½ of a width in the Y-direction of the memory block MB. In each of the conductive layers 110 (SGS), one and the other in the Y-direction are electrically independent of one another in one memory block MB.

On the other hand, the conductive layers 110 (SGD) are separated in the Y-direction for each string unit SU by inter-string unit insulating layers SHE'. Therefore, the conductive layer 110 (SGD) has a width in the Y-direction smaller than those of the other conductive layers 110 (SGS), 110 (WL). Each of the conductive layers 110 (SGD) is electrically independent for each string unit SU.

In this example, as illustrated in FIG. 4, the five inter-string unit insulating layers SHE1 are disposed between the inter-block structures ST. The inter-string unit insulating layer SHE1 at the center in the Y-direction is disposed so as to be overlapped with a row of dummy memory structures 100 arranged in the X-direction at the center in the Y-direction of the memory block MB. The other inter-string unit insulating layers SHE1 are disposed between rows of the memory structures 100 that are adjacent in the Y-direction and arranged in the X-direction such that the other inter-string unit insulating layers SHE1 are in contact with these rows of the memory structures 100. As illustrated in FIG. 4, the source-side dividing insulating layer SHE2 is disposed so as to be overlapped with a row of dummy memory structures 100 arranged in the X-direction at the center in the Y-direction of the memory block MB.

[Structure of Chip $C_P$]

For example, as illustrated in FIG. 5, the chip $C_P$ includes a substrate 200 and a plurality of transistors Tr disposed on the surface of the substrate 200. These plurality of transistors Tr are connected to the configurations inside the chip $C_M$ via the above-described second bonding electrodes $P_{l2}$, and function as the peripheral circuit PC used for controlling the memory cell array MCA. For example, in a read operation, this peripheral circuit PC applies a voltage to a current path including the bit line BL, the semiconductor layer 120, the conductive layer 110, the conductive layer 112, and the conductive layer 141, and determines data stored in the memory cell corresponding to whether a current flows or not, or the like.

In reading (or writing) of data to the memory cell MC, the peripheral circuit PC applies a driving voltage to the conductive layers 110 (SGD) corresponding to the string unit SU to be accessed, and turns on only the drain select transistor STD of the selected one string unit SU. In reading (or writing) of data to the memory cell MC, the peripheral circuit PC applies a driving voltage to the conductive layers 110 (SGS) of one including the selected string unit SU, and turns off the source select transistor STS connected to the conductive layers 110 (SGS) of the other. This makes the memory cells MC not involved in the read operation a floating state.

As illustrated in FIG. 7, the memory structure 100 has a tapered shape having a width in the Y-direction narrowing with increasing distance from the substrate 200 (FIG. 5). More specifically, the memory structure 100 has a width w1 in the Y-direction of the lower end portion larger than a width w2 in the Y-direction of the upper end portion. As illustrated in FIG. 7, the source-side dividing insulating layer SHE2 has a tapered shape having a width in the Y-direction narrowing with decreasing distance from the substrate 200 (FIG. 5). More specifically, the source-side dividing insulating layer SHE2 has a width w3 in the Y-direction of the upper end portion larger than a width w4 in the Y-direction of the lower end portion. As illustrated in FIG. 7, the inter-string unit insulating layers SHE1 has a tapered shape having a width in the Y-direction narrowing with increasing distance from the substrate 200 (FIG. 5), as same as the memory structure 100. More specifically, the inter-string unit insulating layers SHE1 has a width in the Y-direction of the lower end portion larger than a width in the Y-direction of the upper end portion.

[Manufacturing Method]

Next, with reference to FIG. 8 to FIG. 24, a method for manufacturing the memory die MD will be described. FIG. 8 to FIG. 24 are schematic cross-sectional views for describing the manufacturing method, and illustrate cross-sectional surfaces corresponding to FIG. 5.

Figure 8:
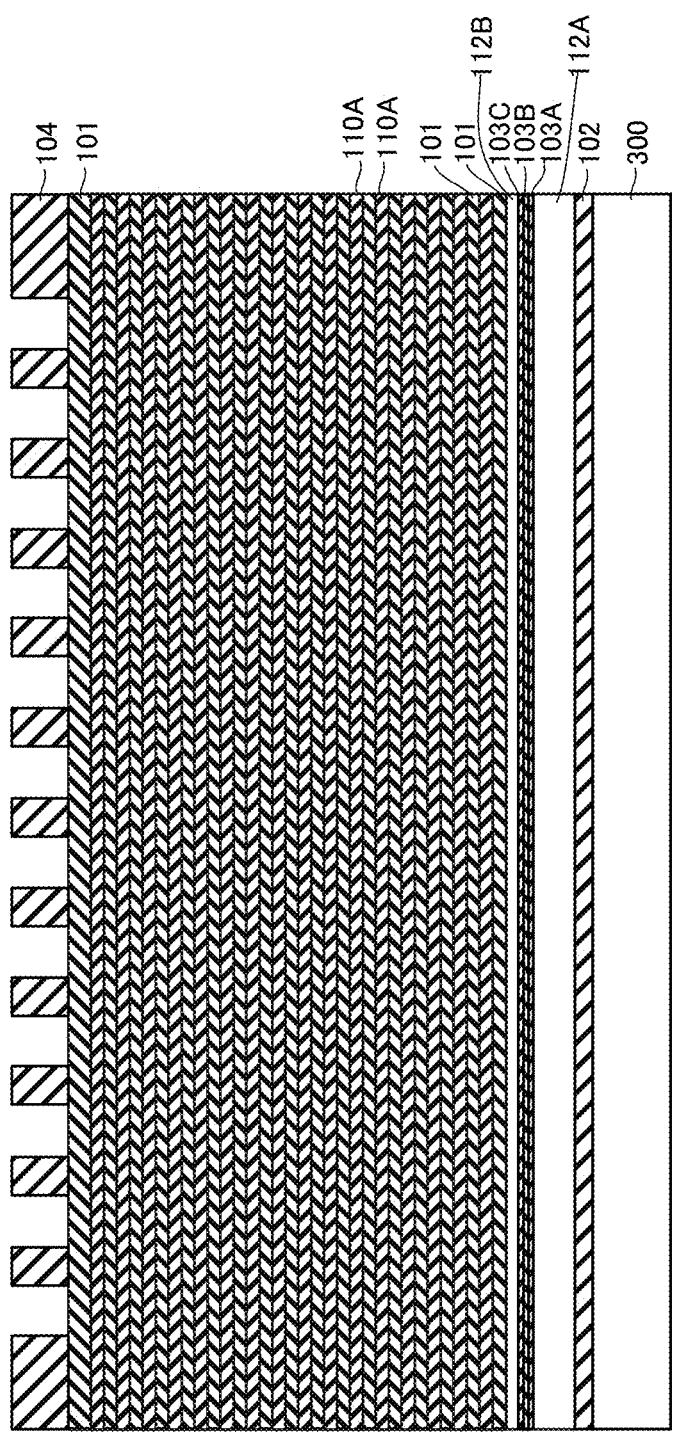
FIG. 8 is a schematic cross-sectional view for describing a method for manufacturing a semiconductor memory device according to the first embodiment.

In the manufacture of the memory die MD according to the embodiment, for example, as illustrated in FIG. 8, an insulating layer 102 of silicon oxide ($SiO_2$) or the like is formed on a substrate 300. For example, this process is performed by a method, such as Chemical Vapor Deposition (CVD). Next, a conductive layer 112A of silicon or the like, a sacrifice layer 103A of silicon oxide ($SiO_2$) or the like, a sacrifice layer 103B of silicon nitride (SiN) or the like, a sacrifice layer 103C of silicon oxide ($SiO_2$) or the like, and a conductive layer 112B of silicon or the like are formed on the insulating layer 102. The conductive layers 112A, 112B may contain, for example, polycrystalline silicon or the like containing N-type impurities, such as phosphorus (P), or P-type impurities, such as boron (B). Next, a plurality of insulating layers 101 of silicon oxide ($SiO_2$) or the like and a plurality of sacrifice layers 110A of silicon nitride (SiN) or the like are alternately formed on the conductive layer 112B. For example, these processes are performed by a method, such as CVD. Next, a resist is formed on the uppermost insulating layer 101 to form a mask 104 by a method of photoetching.

Figure 9:
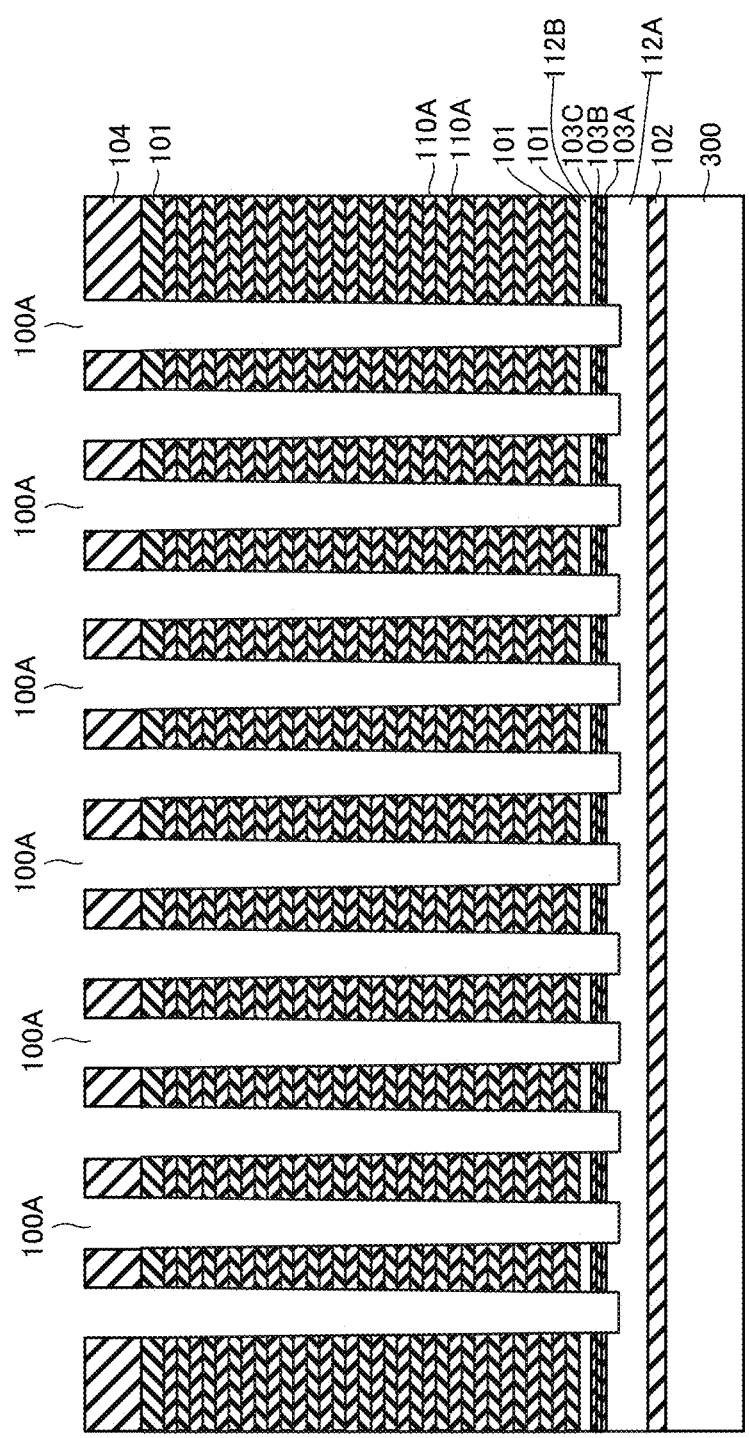
FIG. 9 is a schematic cross-sectional view for describing the manufacturing method.

Next, for example, as illustrated in FIG. 9, using the mask 104, a plurality of memory holes 100A are formed at positions corresponding to the memory structures 100. The memory hole 100A extends in the Z-direction, penetrates the plurality of insulating layers 101, the plurality of sacrifice layers 110A, the conductive layer 112B, and the sacrifice layers 103C, 103B, 103A, and reaches the middle of the conductive layer 112A. For example, this process is performed by a method, such as Reactive Ion Etching (RIE).

Figure 10:
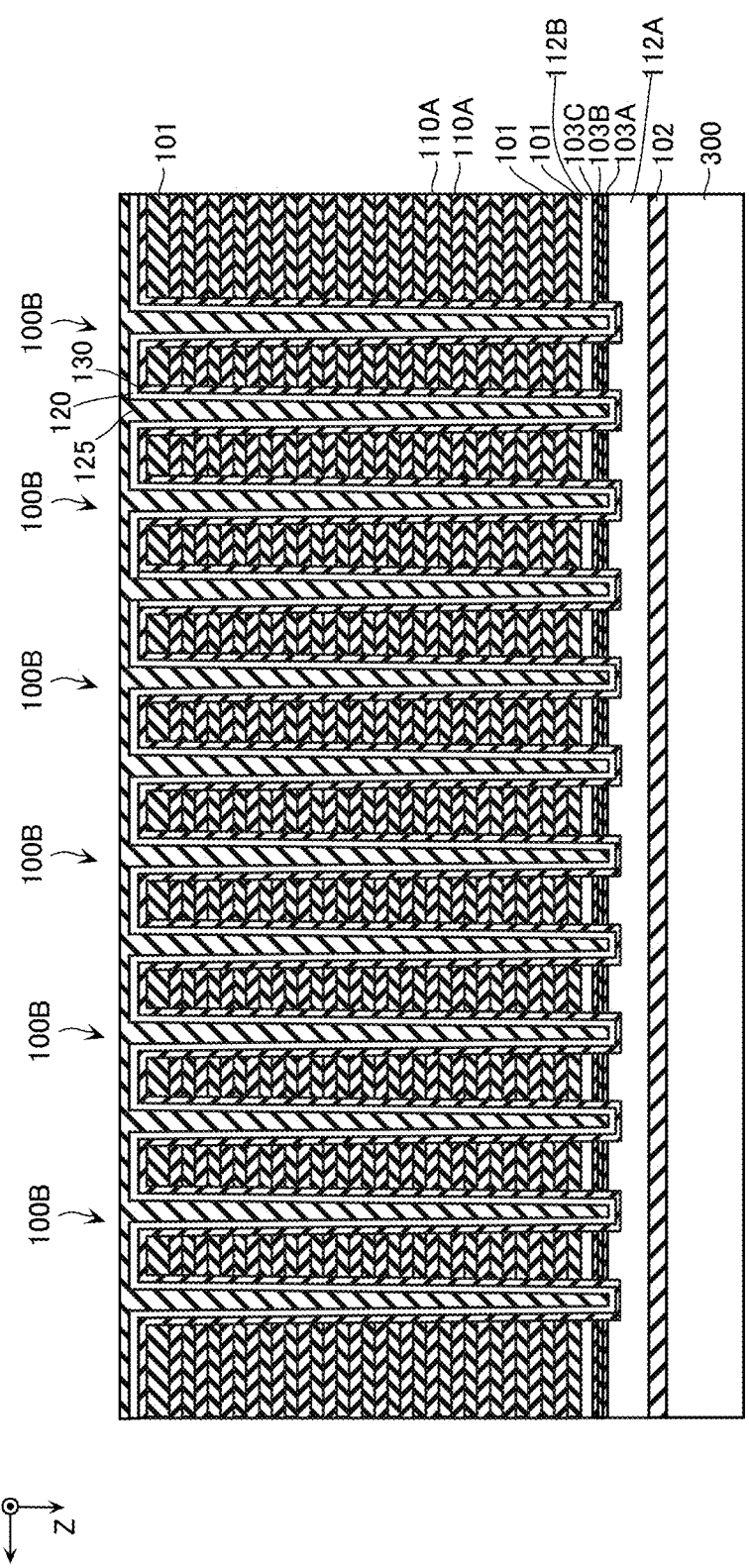
FIG. 10 is a schematic cross-sectional view for describing the manufacturing method.

Next, for example, as illustrated in FIG. 10, the gate insulating film 130, the semiconductor layer 120, and the insulating layer 125 are formed on the upper surface of the uppermost insulating layer 101 and the inner peripheral surface of the memory hole 100A, thus forming a memory structure 100B. In forming the semiconductor layer 120, for example, the film formation by CVD or the like is performed, thereby forming an amorphous silicon (Si) film inside the memory hole 100A. Additionally, for example, by an annealing process or the like, the crystalline structure of this amorphous silicon (Si) film may be modified. Prior to forming the gate insulating film 130 on the inner peripheral surface of the memory hole 100A, insulating layers of silicon oxide ($SiO_2$) or the like may be formed on the respective parts exposed to the memory hole 100A of the conductive layer 112A and the conductive layer 112B by, for example, thermal oxidation or the like.

Figure 11:
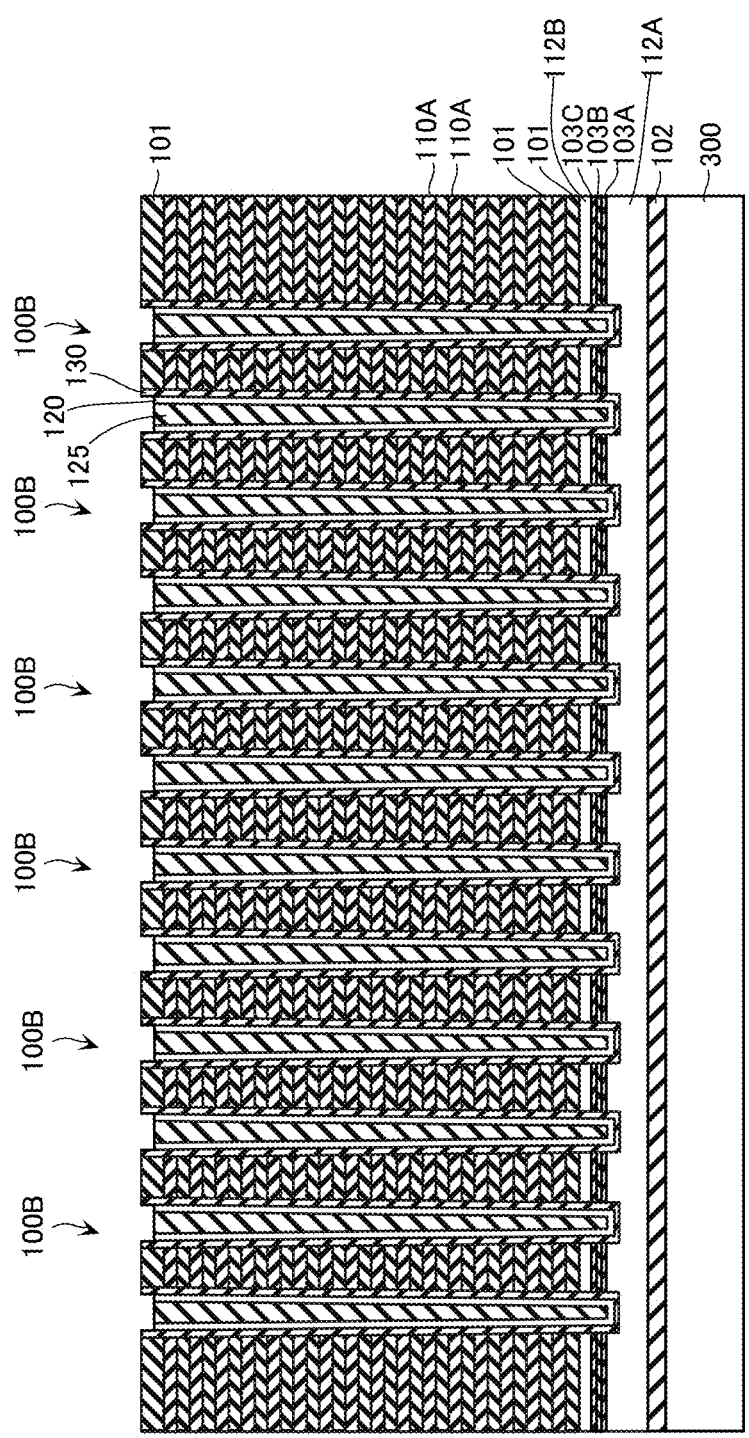
FIG. 11 is a schematic cross-sectional view for describing the manufacturing method.

Next, for example, as illustrated in FIG. 11, the insulating layer 125, the semiconductor layer 120, and the gate insulating film 130 are partially removed to expose the insulating layer 101 positioned in the uppermost layer. The upper end portions of the semiconductor layer 120 and the insulating layer 125 are dug down below the upper surface of the insulating layer 101. For example, this process is performed by a method, such as RIE.

Figure 12:
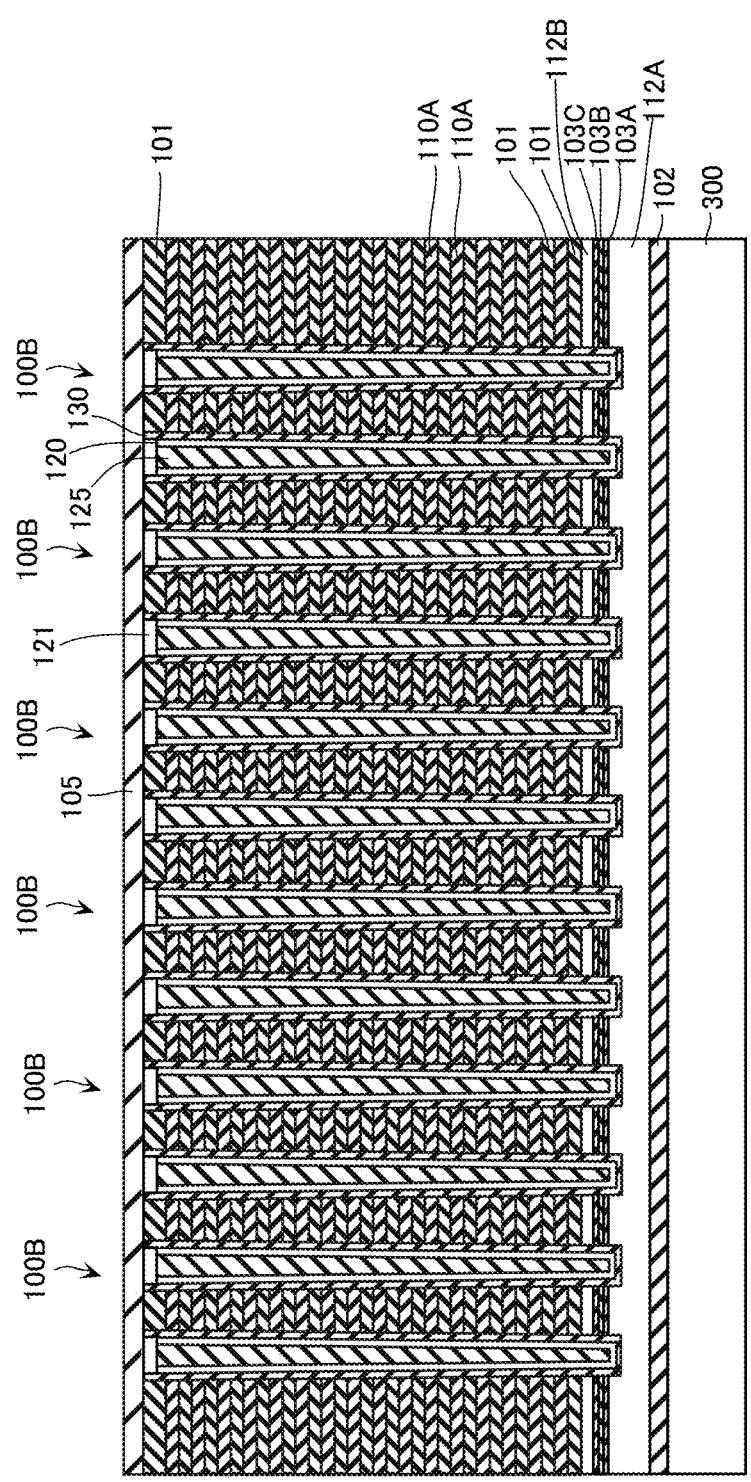
FIG. 12 is a schematic cross-sectional view for describing the manufacturing method.

Next, for example, as illustrated in FIG. 12, on the upper ends of the semiconductor layer 120 and the insulating layer 125, a semiconductor layer 121 is formed. The semiconductor layer 121 contains, for example, amorphous silicon containing N-type impurities, such as phosphorus (P). For example, this process is performed by a method, such as CVD. Next, for example, the semiconductor layer 121 is partially removed by a method, such as RIE, thereby exposing the insulating layer 101 positioned in the uppermost layer. Next, an insulating layer 105 is formed on the insulating layer 101 and the semiconductor layer 121. For example, this process is performed by a method, such as CVD.

Figure 13:
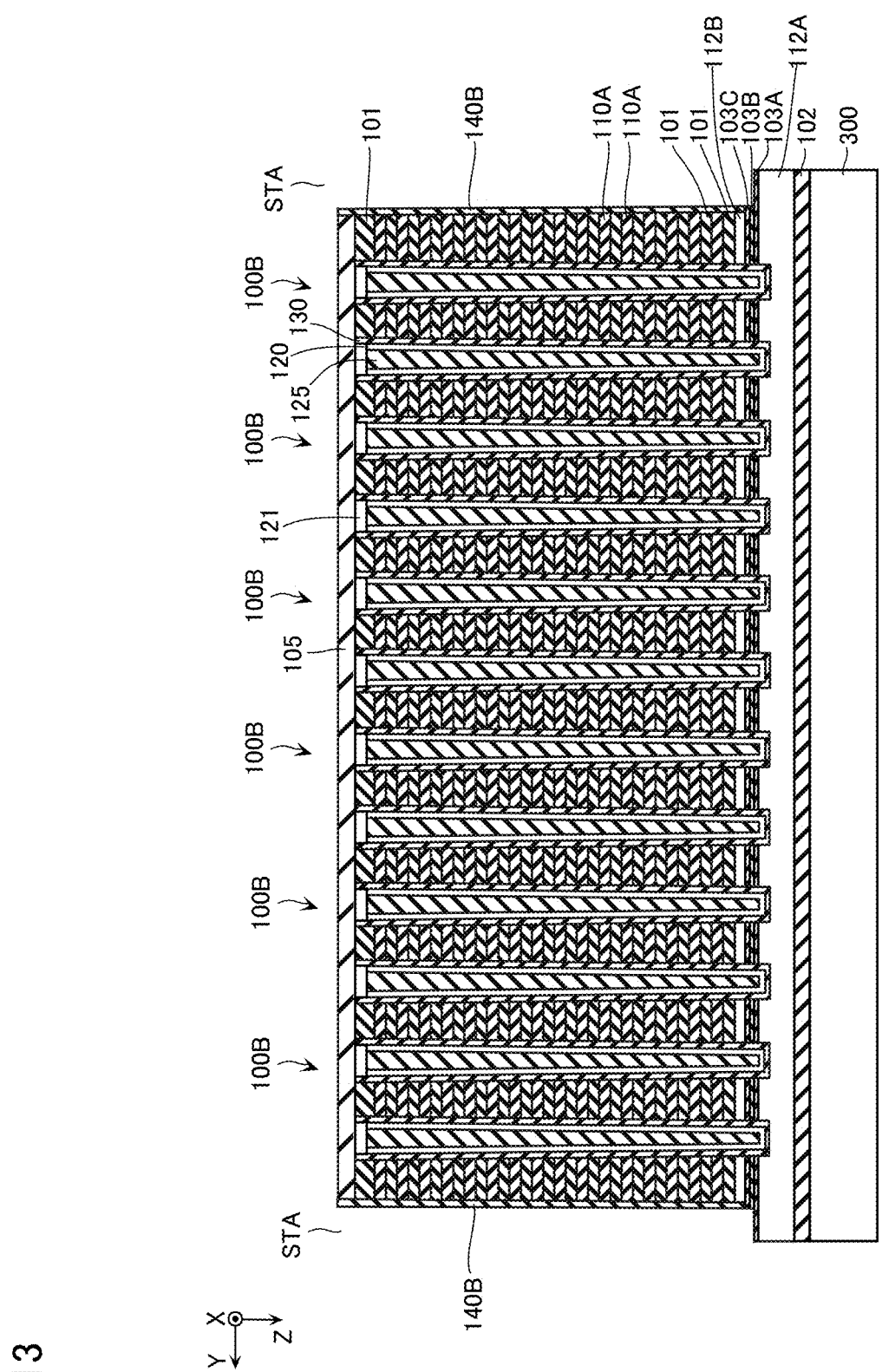
FIG. 13 is a schematic cross-sectional view for describing the manufacturing method.

Next, for example, as illustrated in FIG. 13, trenches STA are formed at positions at which inter-block structures ST are to be formed. The trench STA is a trench that extends in the Z-direction and the X-direction, separates the insulating layer 101, the sacrifice layer 110A, the conductive layer 112B, the sacrifice layer 103C, and the sacrifice layer 103B in the Y-direction, and exposes the upper surface of the sacrifice layer 103A. For example, this process is performed by a method, such as RIE. Next, protective films 140B of silicon nitride or the like are formed on side surfaces in the Y-direction of the trench STA. For example, this process is performed by forming an insulating film of silicon nitride or the like on the side surfaces in the Y-direction and the bottom surface of the trench STA by a method, such as CVD, and subsequently removing the part covering the bottom surface of the trench STA of this insulating film by a method, such as RIE.

Figure 14:
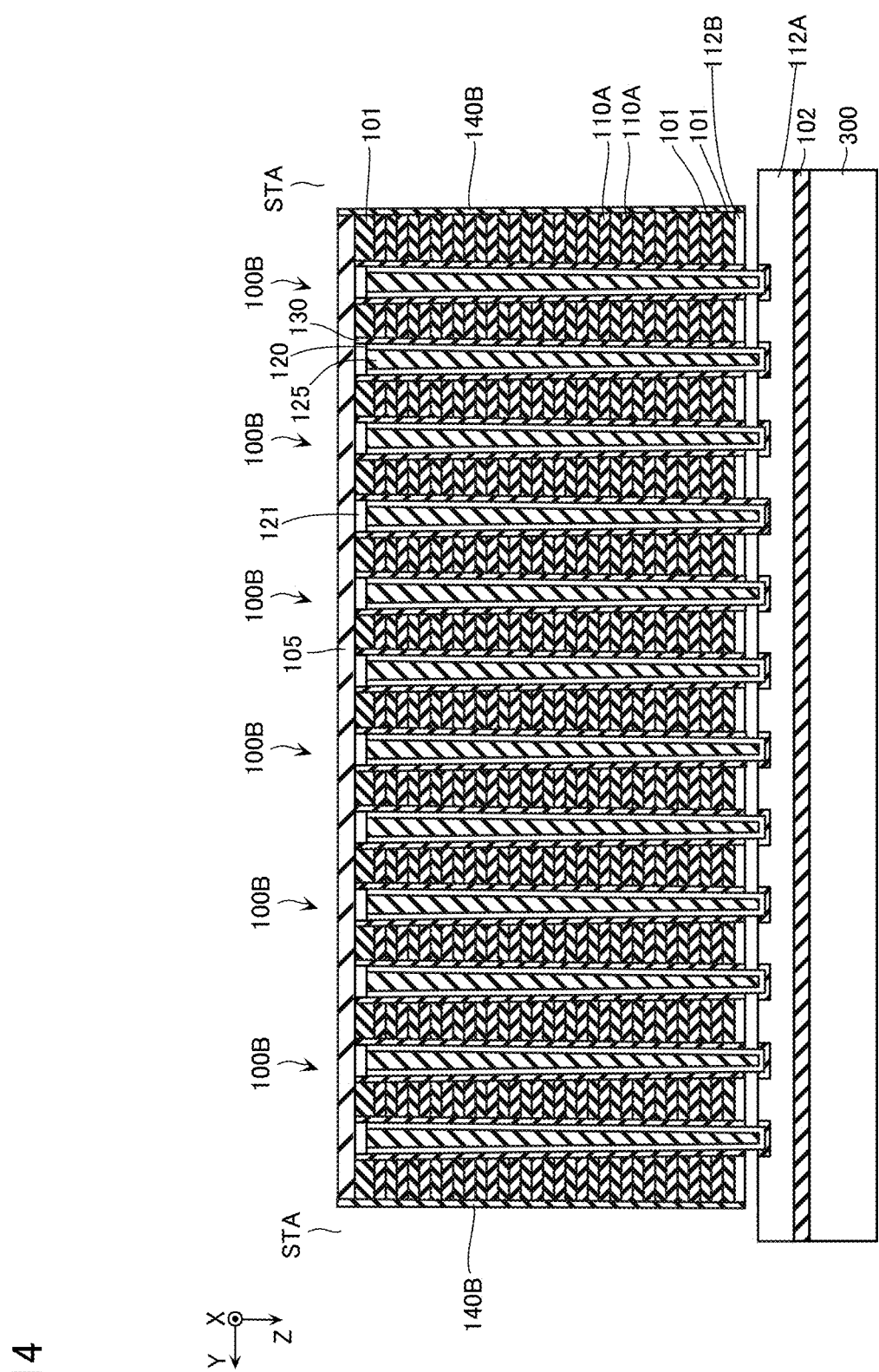
FIG. 14 is a schematic cross-sectional view for describing the manufacturing method.

Next, for example, as illustrated in FIG. 14, the sacrifice layers 103A, 103B, 103C and a part of the gate insulating film 130 are removed, thereby exposing a part of the semiconductor layer 120. For example, this process is performed by a method, such as wet etching.

Figure 15:
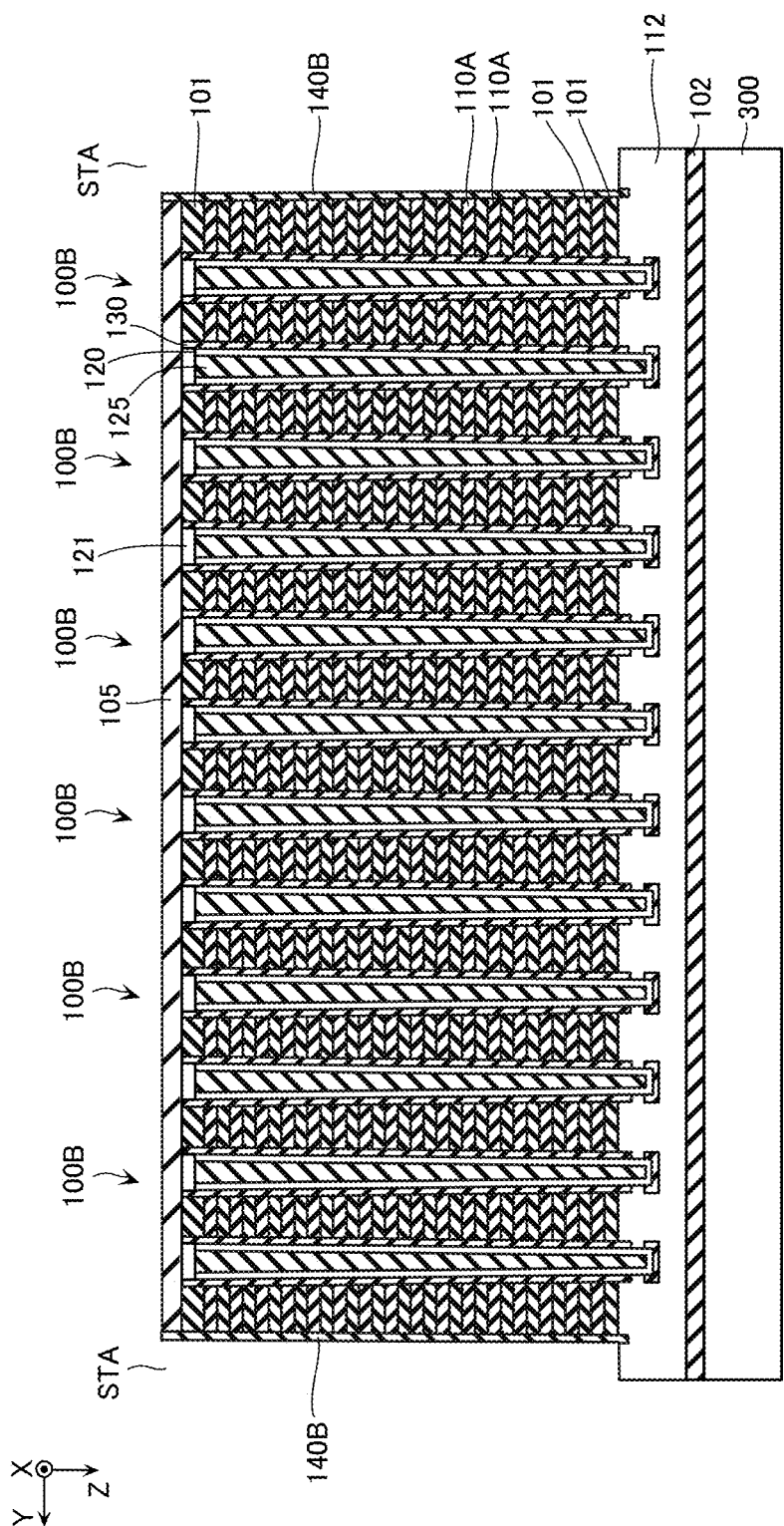
FIG. 15 is a schematic cross-sectional view for describing the manufacturing method.

Next, for example, as illustrated in FIG. 15, a semiconductor layer is formed on the part where the sacrifice layers 103A, 103B, 103C and a part of the gate insulating film 130 have been removed, thus forming a conductive layer 112 by the additionally formed semiconductor layer and the conductive layers 112A, 112B. The semiconductor layer formed inside the trench STA is removed. For example, this process is performed by epitaxial growth and a method, such as RIE.

Figure 16:
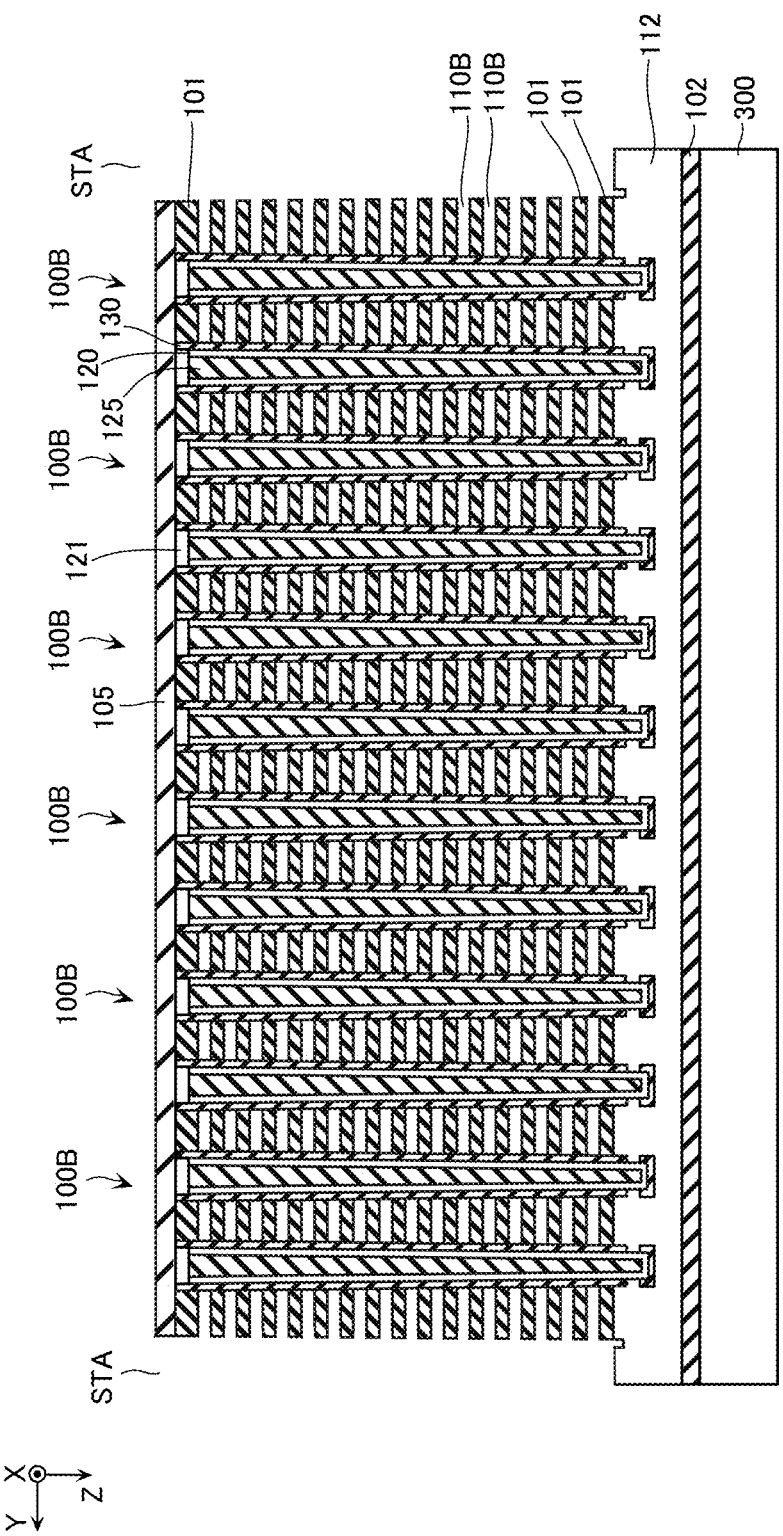
FIG. 16 is a schematic cross-sectional view for describing the manufacturing method.

Next, for example, as illustrated in FIG. 16, the protective film 140B is removed, and the sacrifice layers 110A are removed via the trench STA. For example, this process is performed by a method, such as wet etching. Accordingly, a hollow structure including a plurality of insulating layers 101 arranged in the Z-direction and the memory structure 100B supporting these insulating layers 101 is formed.

Figure 17:
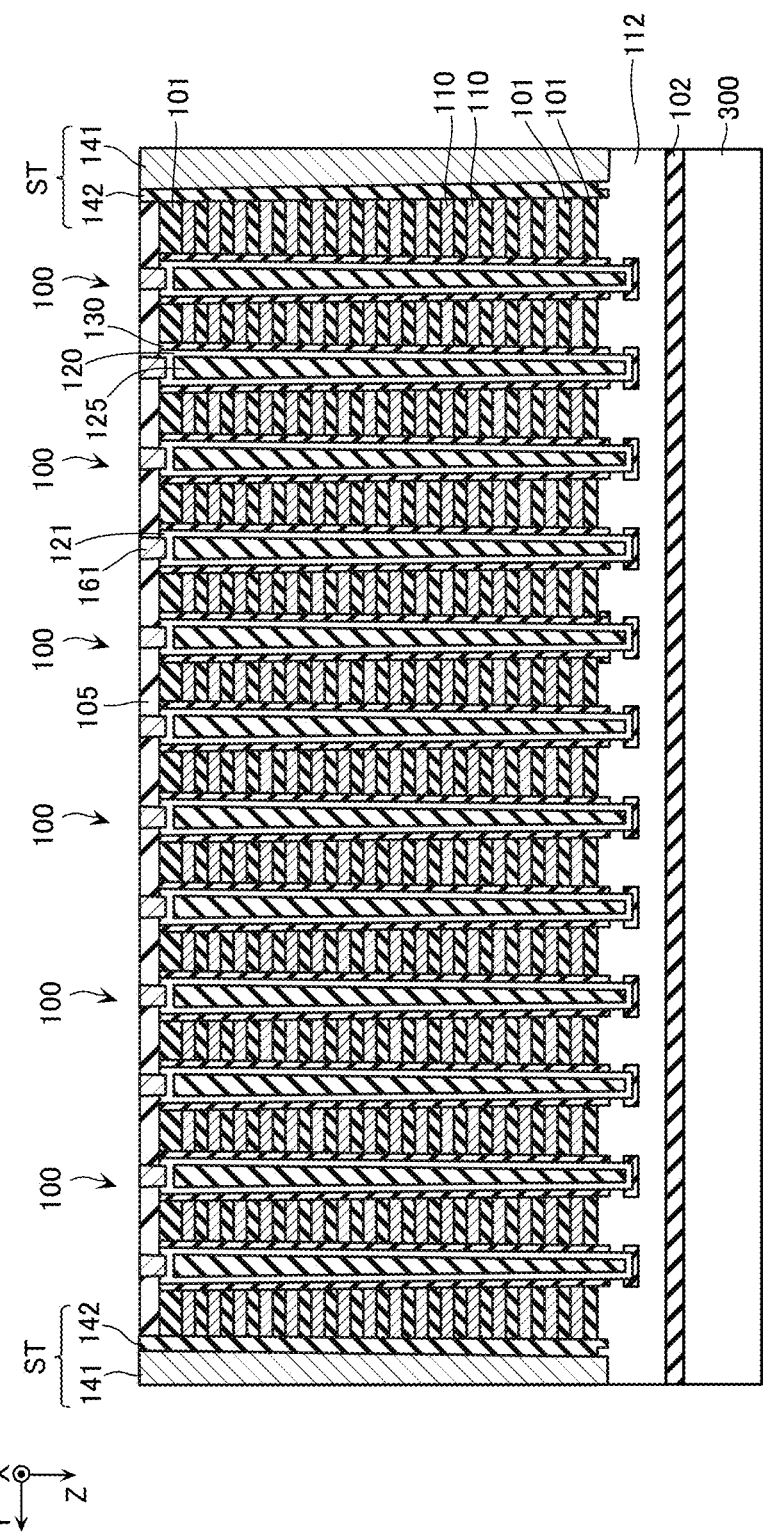
FIG. 17 is a schematic cross-sectional view for describing the manufacturing method.

Next, for example, as illustrated in FIG. 17, the conductive layers 110 are formed in the hollow parts. For example, this process is performed by a method, such as CVD. Next, the insulating layer 142 constituting the inter-block structure ST is formed inside the trench STA. Next, the conductive layer 141 is formed at the center in the Y-direction of the insulating layer 142, and a contact 161 is formed. For example, these processes are performed by methods, such as CVD and RIE. The insulating layer 142 extends from the insulating layer 105 to the conductive layer 112. The conductive layer 141 penetrates the insulating layer 105, and its lower end portion is electrically connected to the conductive layer 112. The contact 161 penetrates the insulating layer 105, and is electrically connected to the semiconductor layer 121 of the memory structure 100.

Figure 18:
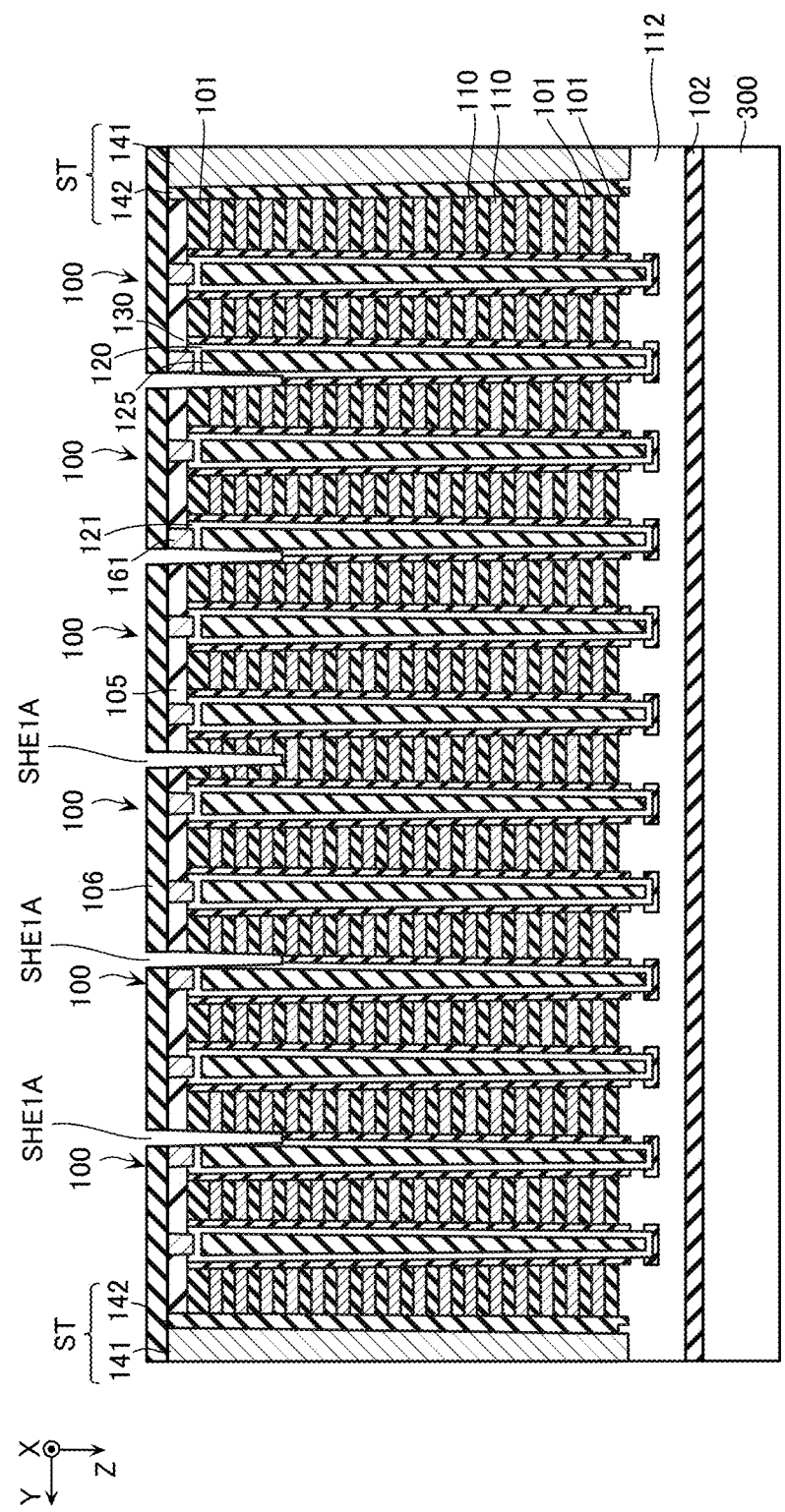
FIG. 18 is a schematic cross-sectional view for describing the manufacturing method.

Next, for example, as illustrated in FIG. 18, a resist is formed on the insulating layer 105 to form a mask 106 by a method of photoetching. Using the mask 106, trenches SHE1A separating the insulating layer 105, the insulating layers 101, and the conductive layers 110 (SGD) in the Y-direction are formed. For example, this process is performed by a method, such as RIE.

Figure 19:
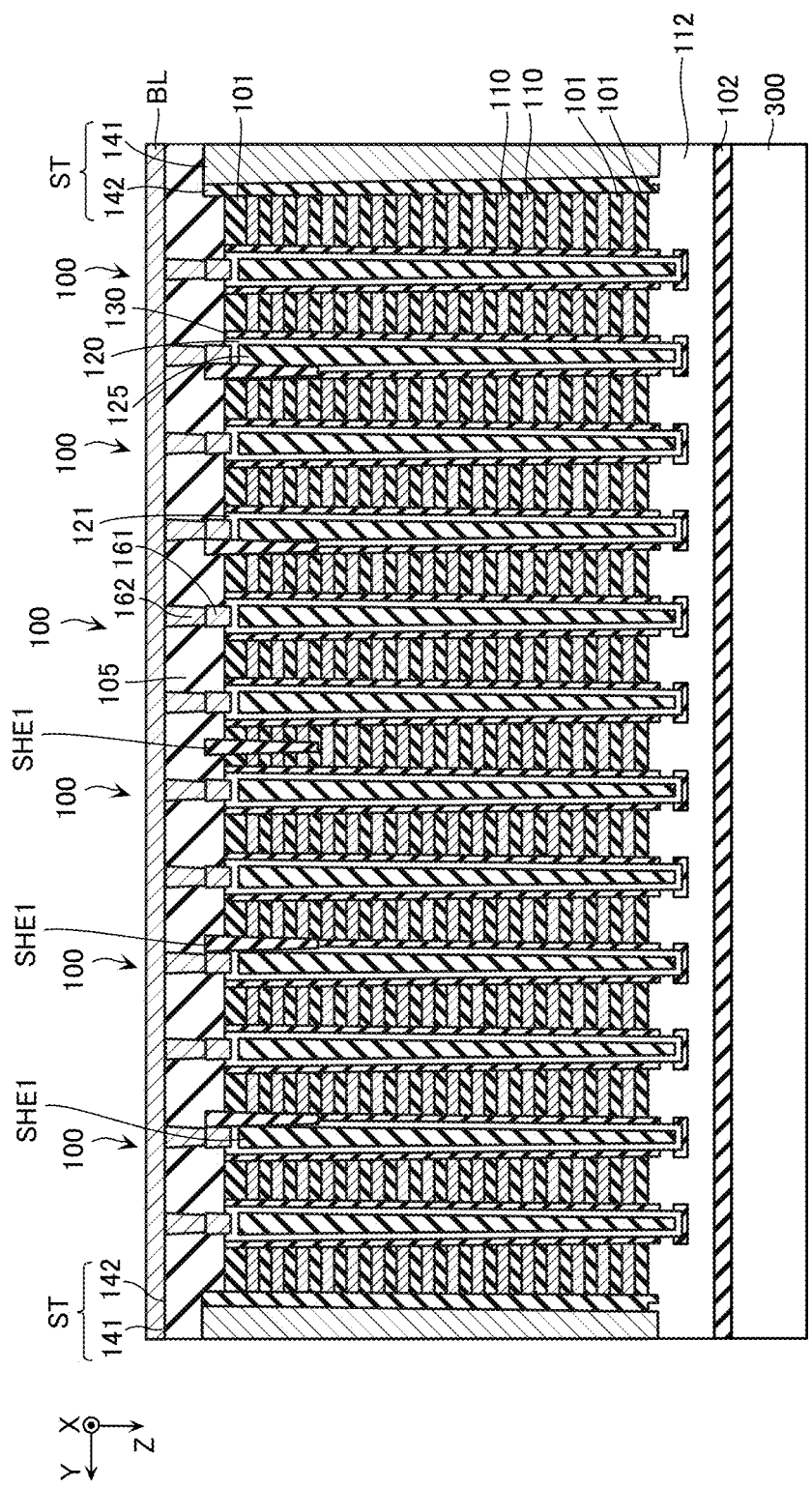
FIG. 19 is a schematic cross-sectional view for describing the manufacturing method.

Next, for example, as illustrated in FIG. 19, the inter-string unit insulating layers SHE1 are formed inside the trenches SHE1A. Next, the insulating layer 105 is stacked over the insulating layer 105. Next, the insulating layer 105 is etched in a predetermined pattern, thus forming contacts 162 connected to the contacts 161 and a bit line BL.

Figure 20:
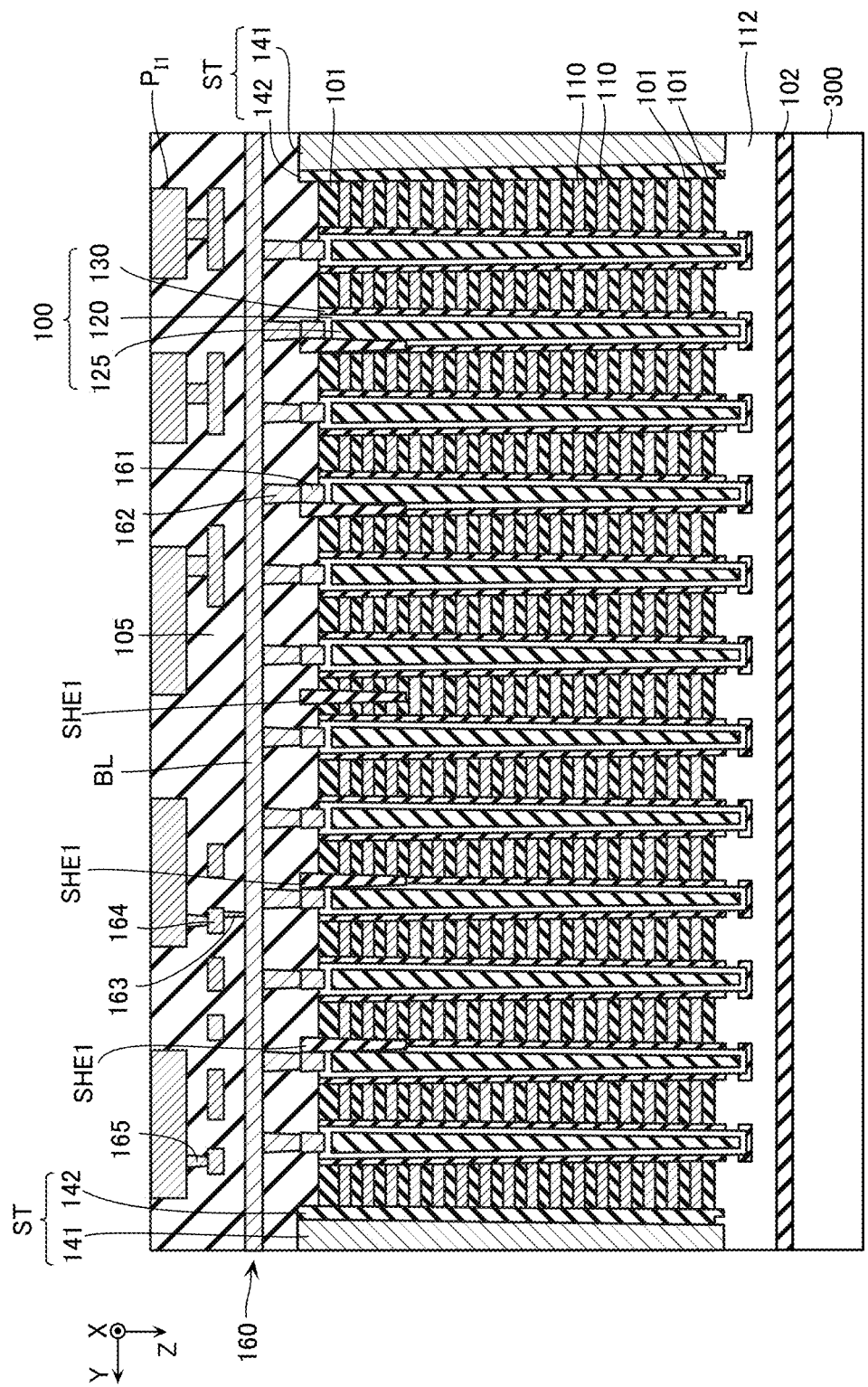
FIG. 20 is a schematic cross-sectional view for describing the manufacturing method.

Next, for example, as illustrated in FIG. 20, the insulating layer 105 is stacked over the bit line BL, and contacts 163, wirings 164, contacts 165, first bonding electrodes $P_{f1}$, and the like are formed. For example, this process is performed by methods, such as CVD, photolithography, and/or etching. Thus, the chip $C_M$ is manufactured.

Figure 21:
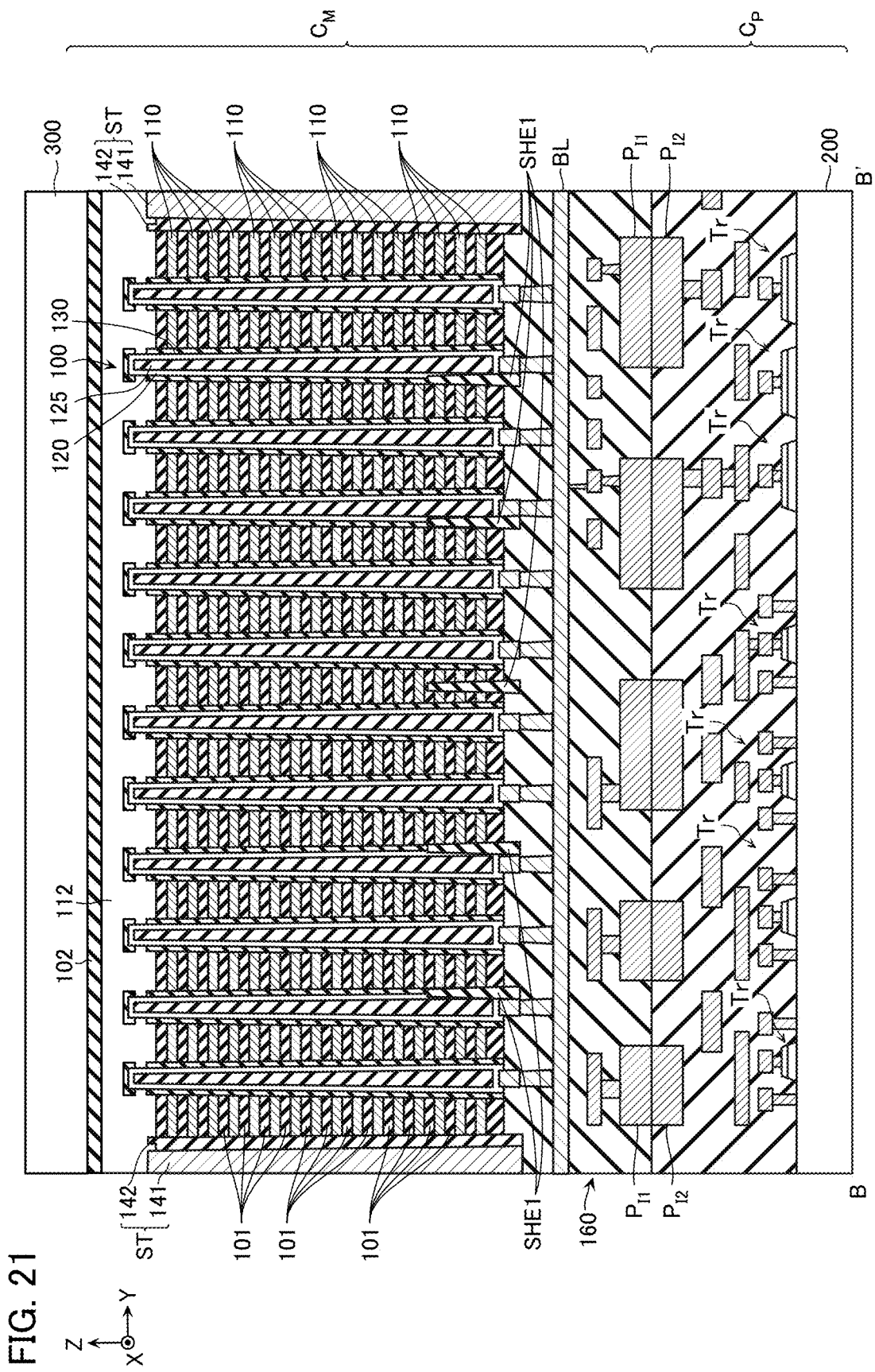
FIG. 21 is a schematic cross-sectional view for describing the manufacturing method.

Next, for example, as illustrated in FIG. 21, a wafer on which the chip $C_M$ has been formed by the above-described process is bonded with a wafer on which the chip $C_P$ has been formed by the other process with the positioning such that the first bonding electrode $P_{f1}$ is connected to the second bonding electrode $P_{f2}$. In this bonding process, for example, one wafer is pressed against the other wafer to bring both wafers into close contact, and a heat treatment or the like is performed. Accordingly, the wafer on which the chip $C_M$ has been formed is bonded with the wafer on which the $C_P$ has been formed via the first bonding electrode $P_{f1}$ and the second bonding electrode $P_{f2}$.

Figure 22:
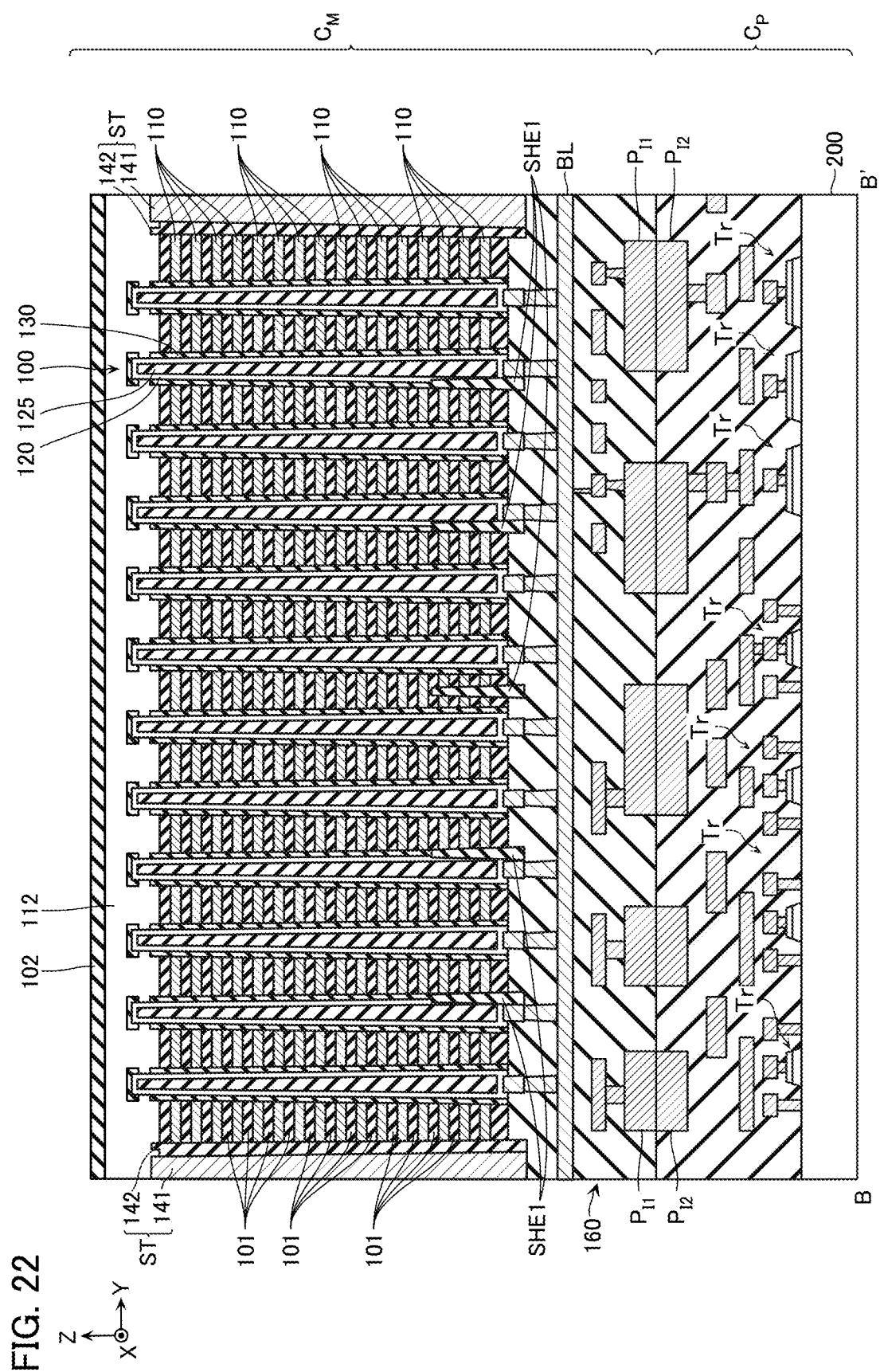
FIG. 22 is a schematic cross-sectional view for describing the manufacturing method.

Next, for example, as illustrated in FIG. 22, the substrate 300 included in the chip $C_M$ is removed.

Figure 23:
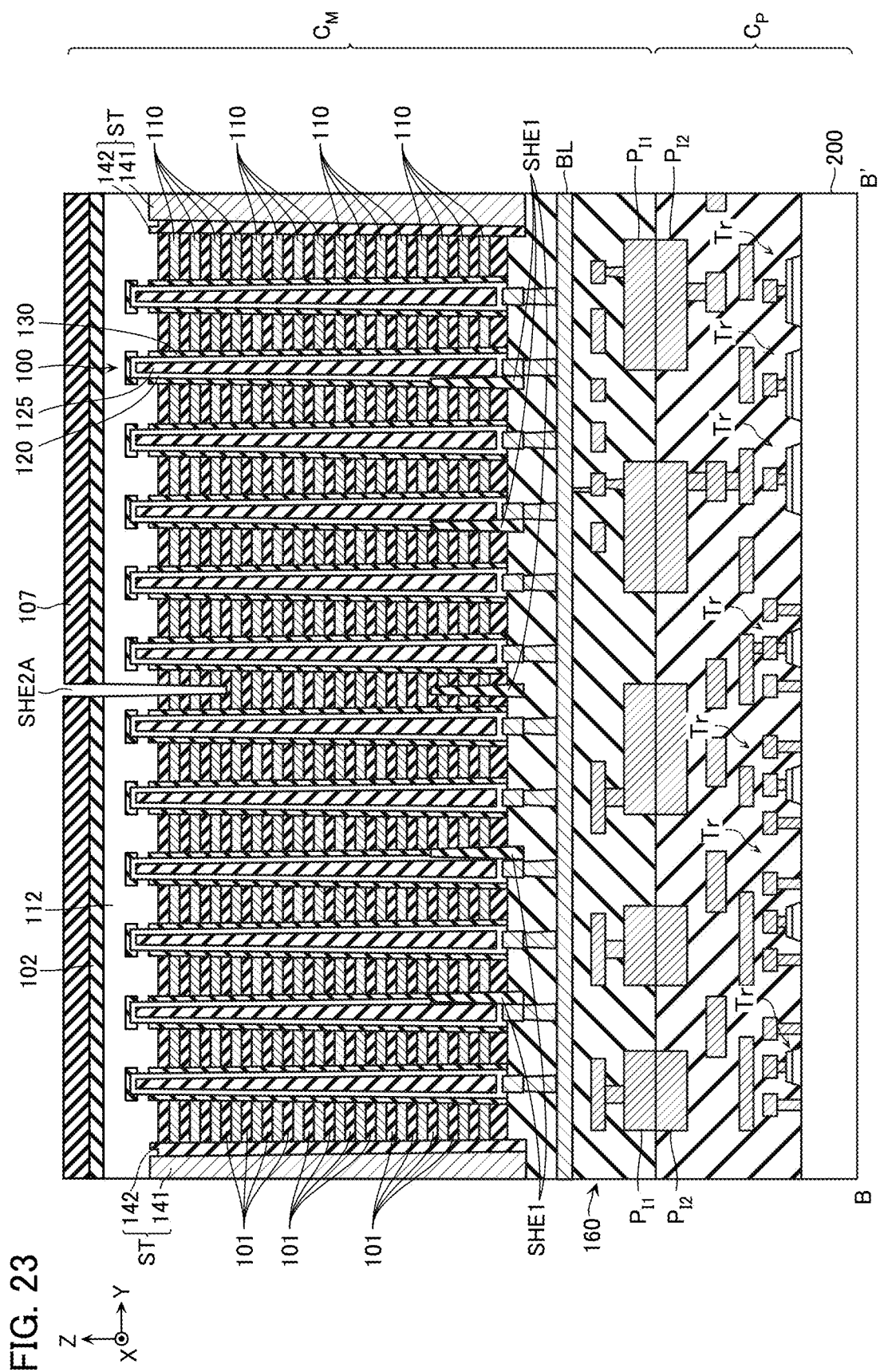
FIG. 23 is a schematic cross-sectional view for describing the manufacturing method.

Next, for example, as illustrated in FIG. 23, a resist is formed on the insulating layer 102 to form a mask 107 by a method of photoetching. Using the mask 107, a trench SHE2A separating the insulating layer 102, the conductive layer 112, and the conductive layers (SGS) into two in the Y-direction is formed. For example, this process is performed by a method, such as RIE.

Figure 24:
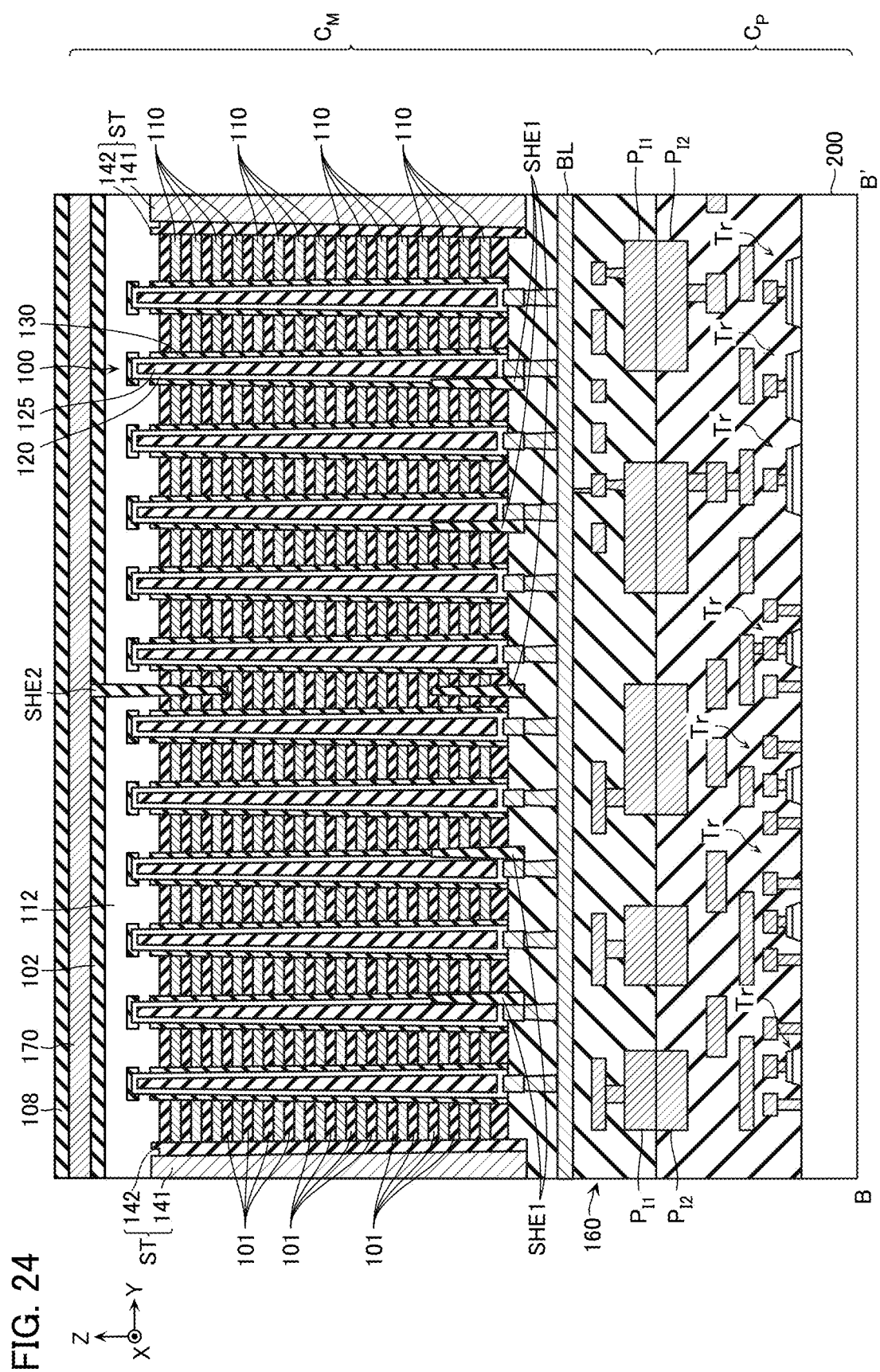
FIG. 24 is a schematic cross-sectional view for describing the manufacturing method.

Next, for example, as illustrated in FIG. 24, the source-side dividing insulating layer SHE2 is formed inside the trench SHE2A. Next, on the insulating layer 102, a wiring layer 170 and an insulating layer 108 are formed. Subsequently, the bonding pad electrodes $P_X$ and the like are formed above this structure, and the structure in which the wafers have been bonded together is diced, thereby forming the memory dies MD.

Effects

According to this embodiment, by separating the source select gate line SGS in one memory block MB into two and selectively driving only one, the load capacity in driving the memory cell MC can be reduced, and the read time can be improved. Since the source-side dividing insulating layer SHE2 for separating the source select gate line SGS can be formed from the upper surface side after bonding the chips $C_M$ and $C_P$ together, the manufacture is facilitated. While the conductive layer 112 is separated by the source-side dividing insulating layer SHE2, the separated conductive layers 112 are each connected to the conductive layer 141 of the inter-block structure ST, and therefore function as a common source.

Further, as illustrated in FIG. 7, the memory structure 100 has a tapered shape having a width in the Y-direction narrowing with increasing distance from the substrate 200, and the source-side dividing insulating layer SHE2 has a tapered shape having a width in the Y-direction narrowing with decreasing distance from the substrate 200. Therefore, a minimum gap g1 between the memory structure 100 and the source-side dividing insulating layer SHE2 can be made wider compared with a case where both have the same tapered shape.

Second Embodiment

Figure 25:
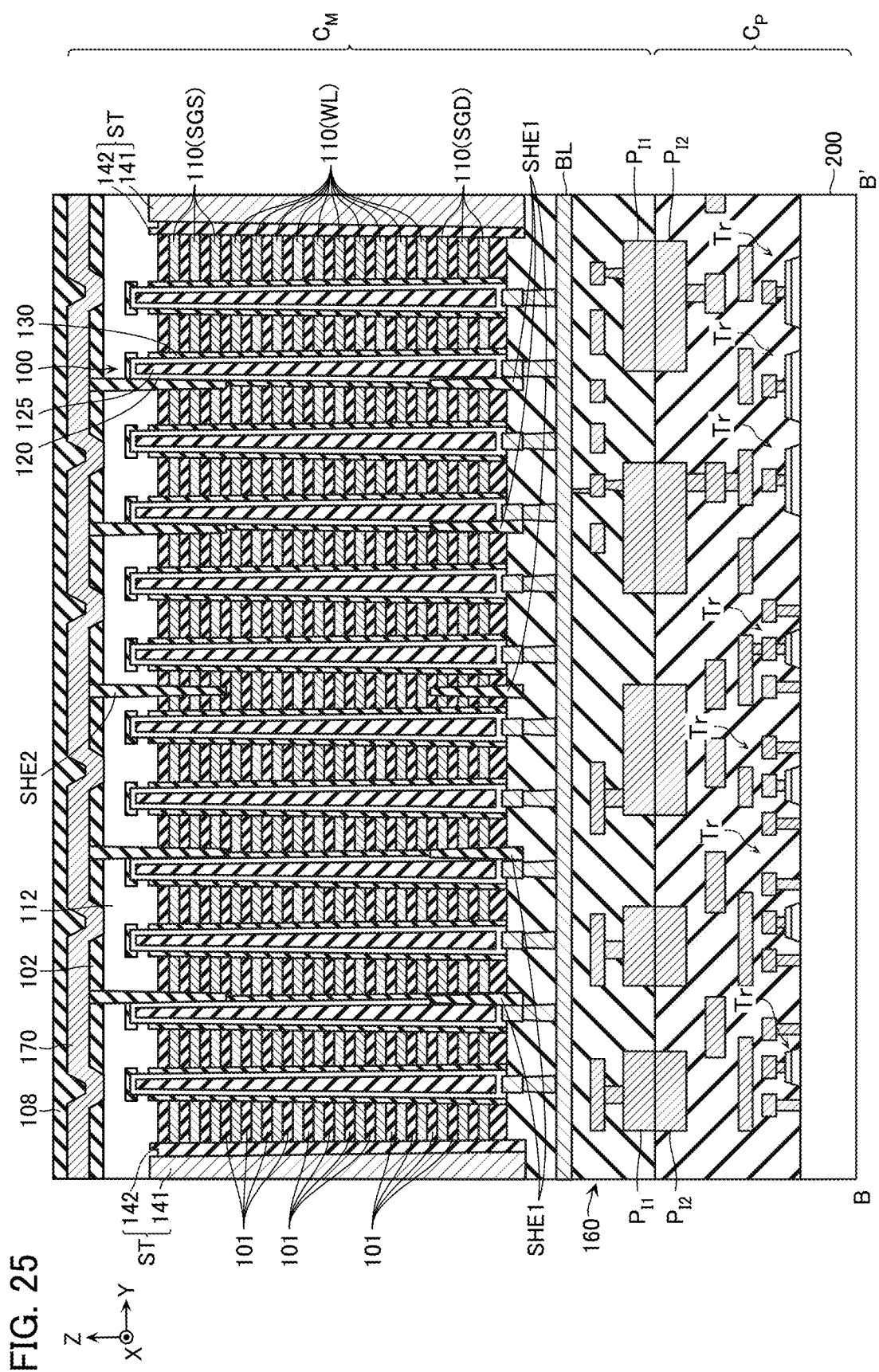
FIG. 25 is a schematic cross-sectional view illustrating a configuration of a semiconductor memory device according to a second embodiment.

Next, with reference to FIG. 25, a configuration of a semiconductor memory device according to the second embodiment will be described. FIG. 25 is a schematic cross-sectional view for describing the configuration of the semiconductor memory device according to the second embodiment.

The semiconductor memory device according to the second embodiment is basically configured similarly to the semiconductor memory device according to the first embodiment. However, the semiconductor memory device according to the second embodiment includes five source-side dividing insulating layers SHE2 in one memory block MB. Similarly to the inter-string unit insulating layer SHE1, the source-side dividing insulating layer SHE2 separates the conductive layer 110 (SGS) for each string unit SU.

The conductive layers 112 separated by the source-side dividing insulating layers SHE2 are mutually connected by, for example, the wiring layer 170, and therefore function as a common source.

According to this embodiment, since the source select gate line SGS and the drain select gate line SGD can be controlled similarly, the control is facilitated. Additionally, since the number of the source select transistors STS to be turned on is reduced compared with the first embodiment, the load capacity in driving the memory cell MC can be further reduced, and the read time can be improved.

Third Embodiment

Figure 26:
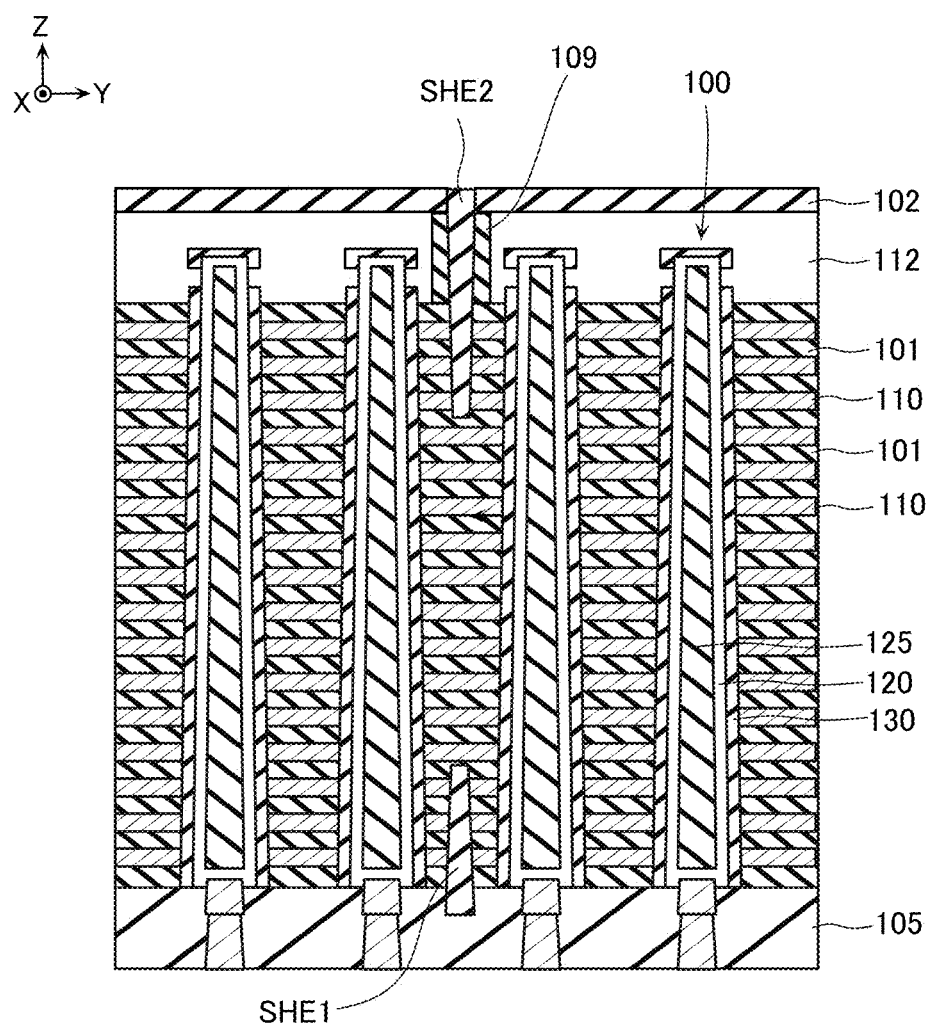
FIG. 26 is a schematic cross-sectional view illustrating a configuration of a semiconductor memory device according to a third embodiment.

Next, with reference to FIG. 26, a configuration of a semiconductor memory device according to the third embodiment will be described. FIG. 26 is a schematic cross-sectional view for describing the configuration of the semiconductor memory device according to the third embodiment.

The semiconductor memory device according to the third embodiment is basically configured similarly to the semiconductor memory device according to the first embodiment. However, the semiconductor memory device according to the third embodiment includes an insulating layer 109 of silicon oxide ($SiO_2$) or the like extending in the X-direction and the Z-direction at the center portion in the Y-direction of the conductive layer 112 in the memory block MB. The source-side dividing insulating layer SHE2 separates the insulating layer 109, the insulating layers 101, and the conductive layers 110 (SGS) in the Y-direction.

Figure 27:
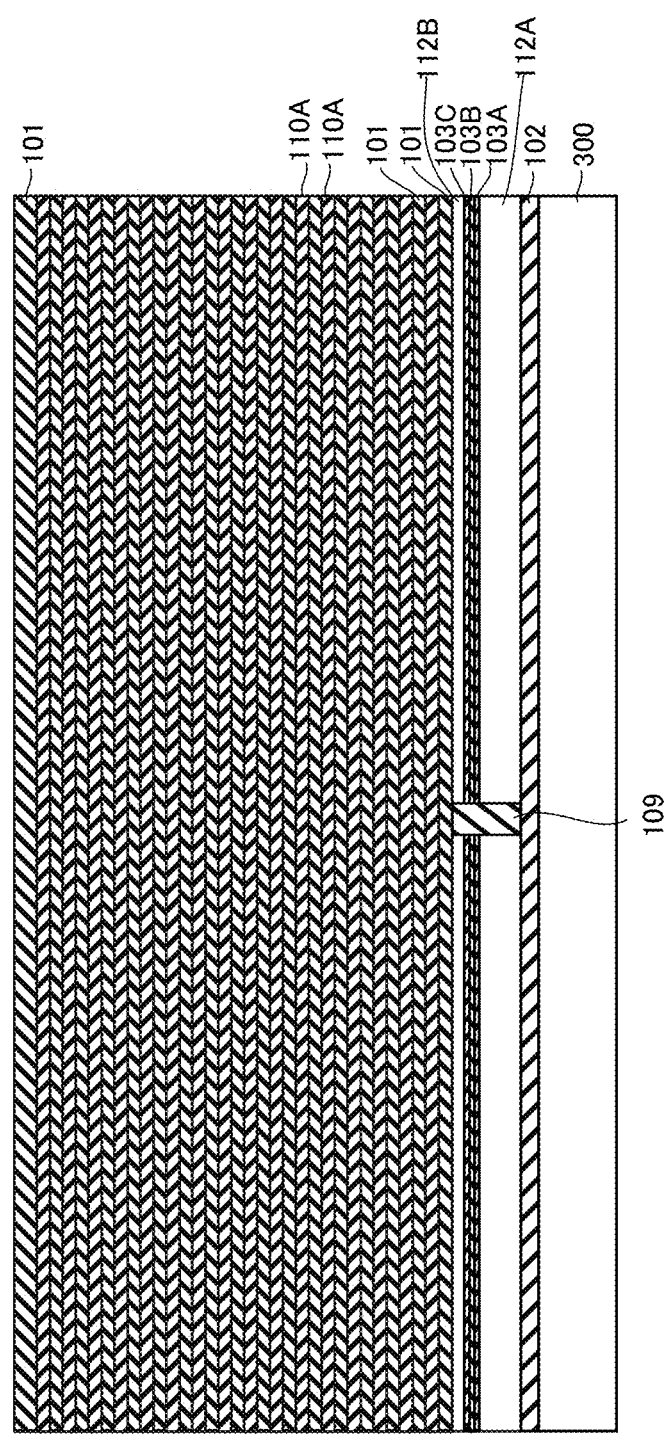
FIG. 27 is a schematic cross-sectional view for describing a manufacturing method of the third embodiment.

FIG. 27 is a drawing for describing a manufacturing method of the third embodiment. In this embodiment, after forming the insulating layer 102, the sacrifice layers 103A, 103B, 103C, and the conductive layer 112B on the substrate 300, the insulating layer 109 is preliminarily formed at the center portion in the Y-direction of the memory block MB. For example, this process is performed by methods, such as photolithography, etching, and/or CVD.

According to the third embodiment, in forming trenches for forming the source-side dividing insulating layers SHE2, since only the insulating layers 109, 101 and the conductive layers 110 (SGS) are taken into account, and the conductive layer 112 of polycrystalline silicon is not etched, the etching condition is simplified.

Fourth Embodiment

Figure 28:
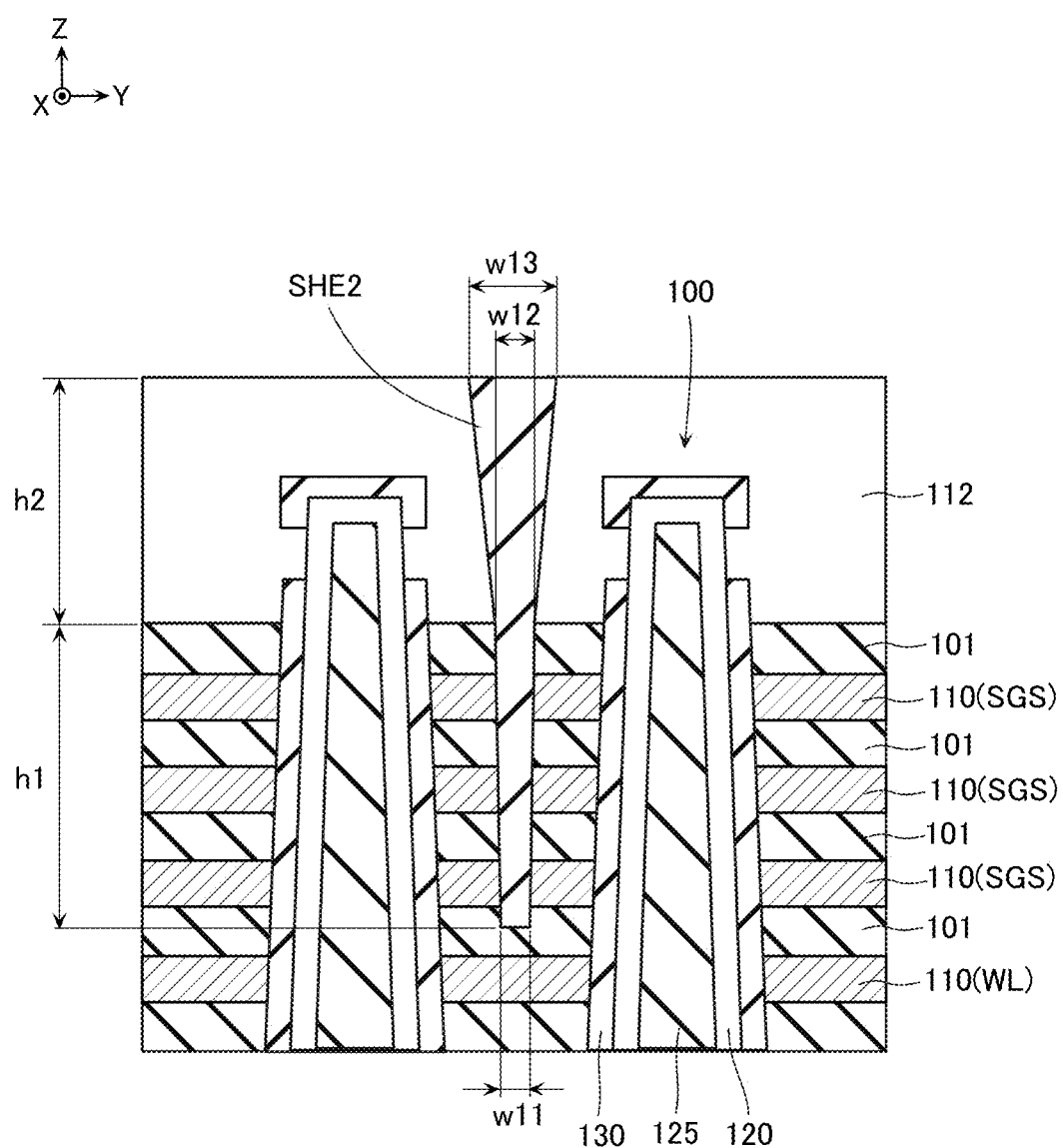
FIG. 28 is a schematic cross-sectional view illustrating a configuration of a semiconductor memory device according to a fourth embodiment.

Next, with reference to FIG. 28, a method for manufacturing a semiconductor memory device according to the fourth embodiment will be described. FIG. 28 is a schematic cross-sectional view for describing the semiconductor memory device according to the fourth embodiment.

The method for manufacturing the semiconductor memory device according to the embodiment is basically similar to the method for manufacturing the semiconductor memory device according to the first embodiment. However, in this embodiment, the conductive layer 112 is used as a mask for forming the source-side dividing insulating layer SHE2. In this case, as illustrated in the drawing, a taper angle in the conductive layer 112 is different from a taper angle in the conductive layer 110 (SGS) depending on the etching condition. In other words, the source-side dividing insulating layer SHE2 includes a first part that is positioned in the substrate 200 side and separates the conductive layer 110 (SGS), and a second part that is positioned in the opposite side of the substrate 200 and separates the conductive layer 112. The second part has a taper larger than that of the first part. More specifically, when the source-side dividing insulating layer SHE2 has a width in the Y-direction at the lower end as w11, a width in the Y-direction in the lower surface of the conductive layer 112 as w12, a width in the Y-direction at the upper end as w13, a height from the lower end to the lower surface of the conductive layer 112 as h1, and a distance from the lower surface of the conductive layer 112 to the upper end as h2, the relation between them is expressed as below.

$$(w12-w11)/h1 < (w13-w12)/h2$$

According to this embodiment, since the conductive layer 112 is used as a mask, the manufacturing process is simplified.

Others

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a substrate;
   a plurality of first conductive layers arranged in a first direction intersecting with a surface of the substrate;
   a memory structure extending in the first direction, the memory structure including a first semiconductor layer opposed to the plurality of first conductive layers and a gate insulating layer disposed between the first semiconductor layer and the plurality of first conductive layers;
   a first wiring connected to an end portion on a side close to the substrate of the first semiconductor layer, the first wiring extending in a second direction intersecting with the first direction;
   a second conductive layer connected to an end portion on a side far from the substrate of the first semiconductor layer;
   a first insulating layer separating the plurality of first conductive layers in the second direction, the first insulating layer extending in a third direction and the first direction, the third direction intersecting with the first direction and the second direction;
   a second insulating layer separating one or a plurality of the first conductive layers disposed on a side closest to the substrate among the plurality of first conductive layers in the second direction, the second insulating layer extending in the first direction and the third direction; and
   a third insulating layer separating one or a plurality of the first conductive layers disposed on a side farthest from the substrate among the plurality of first conductive layers in the second direction, the third insulating layer extending in the first direction and the third direction, wherein
   the memory structure has a tapered shape having a width in the second direction decreasing with increasing distance from the substrate, and
   the third insulating layer has a tapered shape having a width in the second direction decreasing with decreasing distance from the substrate.

2. The semiconductor memory device according to claim 1, wherein
   an end portion on the side far from the substrate of the memory structure includes an exposed portion in which a part of the gate insulating layer on a side surface is removed and a side surface of the first semiconductor layer is exposed, and the exposed portion is electrically connected to the second conductive layer.

3. The semiconductor memory device according to claim 1, comprising
   a third conductive layer disposed along the first insulating layer, extending in the first direction and the third direction, and having one end connected to the second conductive layer.

4. The semiconductor memory device according to claim 1, wherein
   a number of the second insulating layers disposed between the first insulating layers is larger than a number of the third insulating layers disposed between the first insulating layers.

5. The semiconductor memory device according to claim 4, wherein
   the number of the third insulating layers disposed between the first insulating layers is one.

6. The semiconductor memory device according to claim 1, wherein
   a number of the second insulating layers disposed between the first insulating layers is equal to a number of the third insulating layers disposed between the first insulating layers.

7. The semiconductor memory device according to claim 1, wherein
   a width in the second direction of an end portion on a substrate side of the memory structure is larger than a width in the second direction of an end portion on an opposite side of the substrate of the memory structure, and a width in the second direction of an end portion on the substrate side of the third insulating layer is smaller than a width in the second direction of an end portion on an opposite side of the substrate of the third insulating layer.

8. The semiconductor memory device according to claim 1, wherein
the third insulating layer includes a first part that is positioned in a substrate side and separates the first conductive layer, and a second part that separates the second conductive layer, and
the second part has a taper larger than a taper of the first part.

9. The semiconductor memory device according to claim 1, wherein
the second conductive layer is separated in the second direction by a fourth insulating layer, and
the third insulating layer separates the fourth insulating layer and the first conductive layer in the second direction.

10. A semiconductor memory device comprising:
a substrate;
a plurality of first conductive layers arranged in a first direction intersecting with a surface of the substrate;
a memory structure extending in the first direction, the memory structure including a first semiconductor layer opposed to the plurality of first conductive layers and a gate insulating layer disposed between the first semiconductor layer and the plurality of first conductive layers;
a first wiring connected to an end portion on a side close to the substrate of the first semiconductor layer, the first wiring extending in a second direction intersecting with the first direction;
a second conductive layer connected to an end portion on a side far from the substrate of the first semiconductor layer;
a first insulating layer separating the plurality of first conductive layers in the second direction, the first insulating layer extending in a third direction and the first direction, the third direction intersecting with the first direction and the second direction;
a second insulating layer separating one or a plurality of the first conductive layers disposed on a side closest to the substrate among the plurality of first conductive layers in the second direction, the second insulating layer extending in the first direction and the third direction; and
a third insulating layer separating one or a plurality of the first conductive layers disposed on a side farthest from the substrate among the plurality of first conductive layers in the second direction, the third insulating layer extending in the first direction and the third direction, wherein
the second insulating layer has a tapered shape having a width in the second direction decreasing with increasing distance from the substrate, and
the third insulating layer has a tapered shape having a width in the second direction decreasing with decreasing distance from the substrate.

11. The semiconductor memory device according to claim 10, wherein
an end portion on the side far from the substrate of the memory structure includes an exposed portion in which a part of the gate insulating layer on a side surface is removed and a side surface of the first semiconductor layer is exposed, and the exposed portion is electrically connected to the second conductive layer.

12. The semiconductor memory device according to claim 10, comprising
a third conductive layer disposed along the first insulating layer, extending in the first direction and the third direction, and having one end connected to the second conductive layer.

13. The semiconductor memory device according to claim 10, wherein
a number of the second insulating layers disposed between the first insulating layers is larger than a number of the third insulating layers disposed between the first insulating layers.

14. The semiconductor memory device according to claim 13, wherein
the number of the third insulating layers disposed between the first insulating layers is one.

15. The semiconductor memory device according to claim 10, wherein
a number of the second insulating layers disposed between the first insulating layers is equal to a number of the third insulating layers disposed between the first insulating layers.

16. The semiconductor memory device according to claim 10, wherein
a width in the second direction of an end portion on a substrate side of the memory structure is larger than a width in the second direction of an end portion on an opposite side of the substrate of the memory structure, and
a width in the second direction of an end portion on the substrate side of the third insulating layer is smaller than a width in the second direction of an end portion on an opposite side of the substrate of the third insulating layer.

17. The semiconductor memory device according to claim 10, wherein
the third insulating layer includes a first part that is positioned in a substrate side and separates the first conductive layer, and a second part that separates the second conductive layer, and
the second part has a taper larger than a taper of the first part.

18. The semiconductor memory device according to claim 10, wherein
the second conductive layer is separated in the second direction by a fourth insulating layer, and
the third insulating layer separates the fourth insulating layer and the first conductive layer in the second direction.

19. A method for manufacturing a semiconductor memory device, comprising:
forming a plurality of first conductive layers and a memory structure, the plurality of first conductive layers being arranged in a first direction and extending in a second direction intersecting with the first direction, the memory structure extending in the first direction and being opposed to the plurality of first conductive layers;
forming a first insulating layer separating the plurality of first conductive layers in the second direction, the first insulating layer extending in the first direction and a third direction, the third direction intersecting with the first direction and the second direction;
forming a second insulating layer separating one or a plurality of the first conductive layers disposed on one side in the first direction among the plurality of first conductive layers in the second direction, the second insulating layer extending in the first direction and the third direction;

forming a first chip by providing a first bonding electrode in the one side in the first direction of the plurality of first conductive layers;

forming a second chip by providing a second bonding electrode on one side of the substrate;

bonding the first chip and the second chip together with positioning such that the first bonding electrode is connected to the second bonding electrode; and forming a third insulating layer separating one or a plurality of the first conductive layers disposed on an opposite side of the first bonding electrode among the plurality of first conductive layers in the second direction, the third insulating layer extending in the first direction and the third direction.

20. The method for manufacturing a semiconductor memory device according to claim 19, wherein the memory structure is formed such that a width in the second direction is decreased with increasing distance from the first bonding electrode.

* * * * *